US012588509B2

(12) United States Patent
Pabst

(10) Patent No.: US 12,588,509 B2
(45) Date of Patent: Mar. 24, 2026

(54) TERMINAL INTERPOSERS WITH MOLD FLOW CHANNELS, CIRCUIT MODULES INCLUDING SUCH TERMINAL INTERPOSERS, AND ASSOCIATED METHODS

(71) Applicant: NXP USA, Inc., Austin, TX (US)

(72) Inventor: Eduard Jan Pabst, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 510 days.

(21) Appl. No.: 18/175,559

(22) Filed: Feb. 28, 2023

(65) Prior Publication Data

US 2024/0290685 A1     Aug. 29, 2024

(51) Int. Cl.
| | |
|---|---|
| *H10W 40/70* | (2026.01) |
| *H05K 1/02* | (2006.01) |
| *H10W 40/10* | (2026.01) |
| *H10W 44/20* | (2026.01) |
| *H10W 74/10* | (2026.01) |
| *H10W 90/00* | (2026.01) |

(52) U.S. Cl.
CPC .......... *H10W 40/70* (2026.01); *H05K 1/0206* (2013.01); *H10W 40/10* (2026.01); *H10W 44/20* (2026.01); *H10W 74/117* (2026.01); *H10W 90/701* (2026.01)

(58) Field of Classification Search
None
See application file for complete search history.

(56) References Cited

U.S. PATENT DOCUMENTS

| | | | | |
|---|---|---|---|---|
| 9,974,174 | B1 * | 5/2018 | Wenzel | ............. H01L 23/49827 |
| 10,595,412 | B2 * | 3/2020 | Sasaki | ................. H01L 23/5386 |
| 11,348,807 | B2 * | 5/2022 | Kang | .................. H01L 21/6835 |
| 11,581,241 | B2 * | 2/2023 | Low | ..................... H01L 23/3677 |
| 2003/0134450 | A1 * | 7/2003 | Lee | ..................... H01L 23/4985 |
| | | | | 257/E21.705 |
| 2013/0277855 | A1 * | 10/2013 | Kang | ................ H01L 23/49816 |
| | | | | 257/774 |
| 2016/0021780 | A1 * | 1/2016 | Schwarz | .................. H05K 1/09 |
| | | | | 361/709 |
| 2016/0150632 | A1 * | 5/2016 | Viswanathan | .......... H03F 1/565 |
| | | | | 29/829 |
| 2019/0393138 | A1 * | 12/2019 | Milo | ................... H01L 21/4821 |

(Continued)

*Primary Examiner* — Dale E Page
*Assistant Examiner* — Rohit Parthasarathy
(74) *Attorney, Agent, or Firm* — Sherry W. Gourlay

(57) ABSTRACT

A circuit module includes a module substrate, a terminal interposer, and encapsulant material. The module substrate has a mounting surface and a plurality of conductive pads at the mounting surface. The terminal interposer is coupled to the mounting surface of the module substrate. The terminal interposer includes a dielectric body and a conductive terminal. The dielectric body has top, bottom, and side surfaces, and one or more mold flow channels extending from at least one of the side surfaces into the dielectric body. The conductive terminal is embedded within the dielectric body and extends between the top and bottom surfaces of the dielectric body. A proximal end of the conductive terminal is coupled to a first conductive pad of the plurality of conductive pads. The encapsulant material covers at least a portion of the mounting surface of the module substrate and extends into the one or more mold flow channels.

21 Claims, 13 Drawing Sheets

(56)                    References Cited

U.S. PATENT DOCUMENTS

| | | | |
|---|---|---|---|
| 2020/0388572 A1* | 12/2020 | Aygun | H01L 21/76283 |
| 2021/0210360 A1* | 7/2021 | Kang | H01L 25/0655 |
| 2022/0165651 A1* | 5/2022 | Kwak | H01L 21/565 |
| 2022/0208646 A1* | 6/2022 | Low | H01L 23/3677 |
| 2022/0208670 A1* | 6/2022 | Jones | H01L 25/072 |
| 2022/0384307 A1* | 12/2022 | Li | H01L 23/3735 |
| 2023/0014716 A1* | 1/2023 | English | G01R 1/045 |
| 2023/0148222 A1* | 5/2023 | Noh | H01L 23/49811 |
| | | | 257/690 |
| 2023/0317539 A1* | 10/2023 | Noh | H01L 24/13 |
| | | | 257/787 |
| 2024/0203912 A1* | 6/2024 | Roberts | H01L 23/3677 |
| 2024/0290685 A1* | 8/2024 | Pabst | H01L 23/49811 |

* cited by examiner

TERMINAL INTERPOSERS WITH MOLD FLOW CHANNELS, CIRCUIT MODULES INCLUDING SUCH TERMINAL INTERPOSERS, AND ASSOCIATED METHODS

TECHNICAL FIELD

Embodiments of the subject matter described herein relate generally to circuit modules, and more particularly to over-molded circuit modules that include embedded terminals.

BACKGROUND

Wireless communication systems employ power amplifier modules for increasing the power of radio frequency (RF) signals. A power amplifier module includes a module substrate and amplifier circuitry coupled to a top surface of the module substrate. A typical module substrate also may include input and output (I/O) terminals on a bottom surface of the module substrate (i.e., "module I/O terminals"), and conductive signal routing structures extending through the module substrate between the module I/O terminals and bondpads at the top surface of the module substrate.

The amplifier circuitry coupled to the top surface often includes a power transistor die, which has at least one integrated power transistor. To convey RF signals between the module substrate and the power transistor die, electrical connections are made between the bondpads at the top surface of the module substrate and the I/O bondpads of the power transistor die. When the integrated power transistor is a field effect transistor (FET), the die's input bondpad connects to the gate terminal of the FET, and the die's output bondpad connects to the drain terminal of the FET. The source terminal of the FET may be coupled through the die to the bottom-side, conductive ground layer, which in turn is connected to the module substrate (e.g., to a ground/thermal dissipation structure embedded in the module substrate).

To integrate the above-described power amplifier module into a communication system, the module typically is coupled to a mounting surface of a system printed circuit board (PCB). More specifically, the bottom surface of the module substrate is connected to the top surface of the system PCB so that the module I/O terminals align with corresponding I/O pads on the PCB mounting surface. In addition, the module substrate is connected to the system PCB so that any module ground/thermal dissipation structure(s) embedded in the module substrate contact a PCB heat spreader that extends through the system PCB. Accordingly, the combination of the module ground/thermal dissipation structure and the system PCB heat spreader may perform the dual function of providing a thermal pathway to remove heat generated by the power transistor die, and providing a ground reference to the power transistor die.

During operation, the power transistor amplifies input RF signals received through the transistor die input bondpad, and conveys the amplified RF signal to the transistor die output bondpad. All the while, heat generated by the power transistor die is dissipated through the ground/thermal dissipation structure(s) embedded in the module substrate and through the system PCB heat spreader, and a ground reference also is provided through the ground/thermal dissipation structure(s) and the system PCB heat spreader.

The above-described configuration works well for many applications. However, other applications may require a different configuration in which a thermal path for the heat produced by the power transistor die extends in a direction away from the system PCB, rather than through the system PCB. Such different configurations generate new challenges, however, including challenges associated with providing input/output signals, bias voltages, and an adequate ground reference for the power transistor die.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
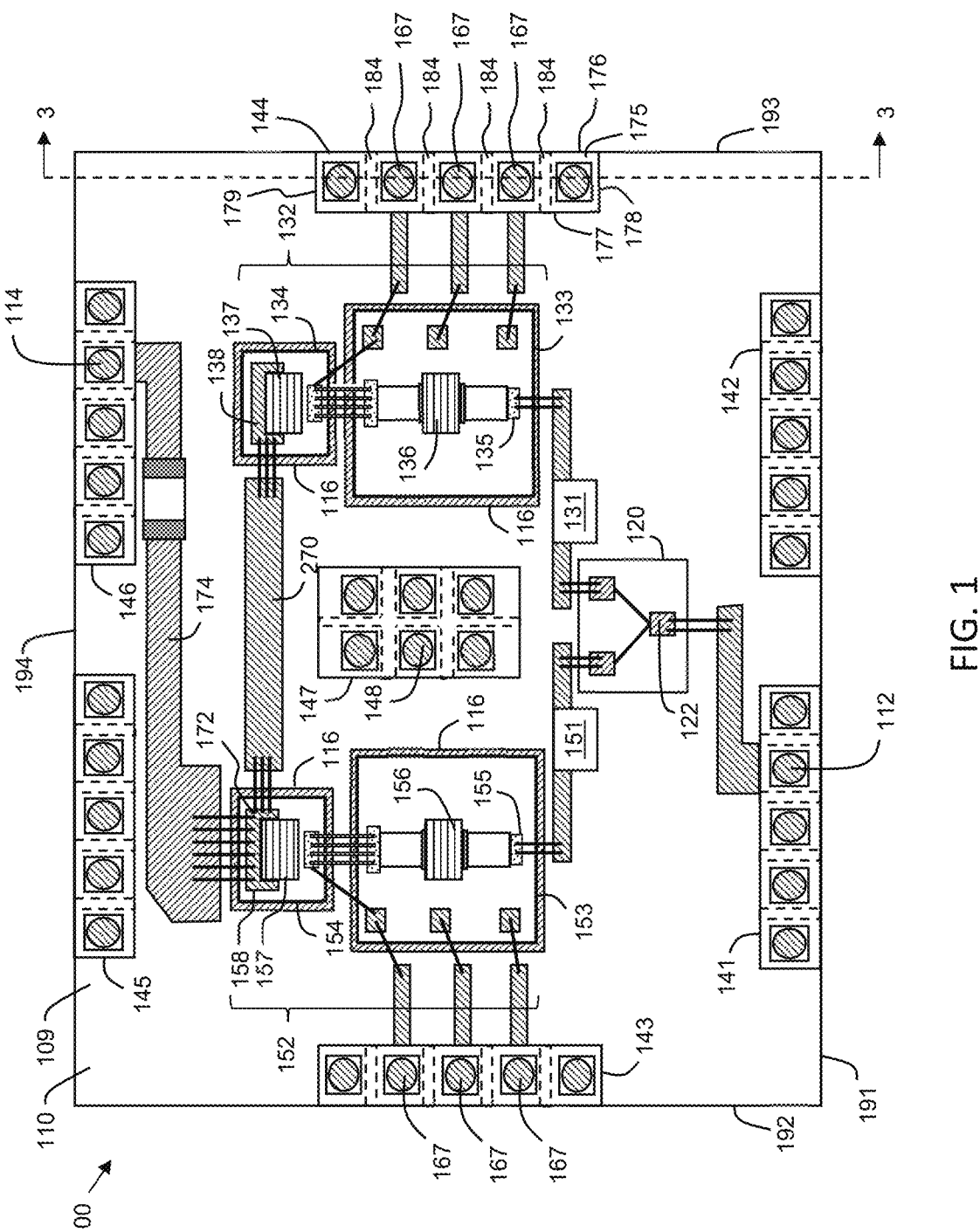
FIG. 1 is a top view of a circuit module, in accordance with an example embodiment.

Embodiments of the inventive subject matter described herein include circuit modules, which include a module substrate with a mounting surface, a semiconductor die at the mounting surface, and one or more terminal interposers connected to pads at the mounting surface. According to several embodiments, each terminal interposer includes a dielectric body with one or more embedded terminals. In addition, each terminal interposer includes one or more mold flow channels extending into and/or through the dielectric body. After the terminal interposer is connected to the mounting surface of the module substrate, encapsulant material is applied over at least a portion of the mounting surface of the module substrate. This encapsulant material flows into the mold flow channel(s) of the terminal interposer.

The combination of the mold flow channels and the encapsulant within the mold flow channels may ensure a more robust and solid connection of the terminal interposer and the module substrate, and may reduce or eliminate solder bridging and/or weeping during solder reflow processes. More specifically, during assembly of a module substrate and a terminal interposer, first ends of each conductive terminal of the terminal interposer are connected (e.g., soldered) to corresponding pads on the mounting surface of the module substrate. When the encapsulant material thereafter is applied to the mounting surface of the substrate, some of the encapsulant material flows into the mold flow channels between the connected terminals and pads.

If the mold flow channels were not present in the terminal interposer, there may only be a thin layer of encapsulant material under the terminal interposer between the connected terminals (of the interposer) and pads (of the substrate). If that thin encapsulant layer failed to properly bond the terminal interposer and the module substrate (i.e., if the encapsulant were to delaminate), solder bridging may occur during subsequent processes to which the module is subjected (e.g., during subsequent solder reflow processes). More specifically, solder that connects the terminals and pads may travel under the delaminated layer and short together adjacent pads. In addition, solder weeping may occur, during which the solder that connects the terminals and pads may travel to and bead at the edge of the circuit module. This solder weeping may result in solder voids, which may compromise the integrity of the connections between the terminals and pads.

According to the various embodiments of the present invention, however, the mold flow channels enable a significantly thicker layer of encapsulant material to be provided between adjacent terminals and pads, which may result in a much more robust connection between the terminal interposer and the module substrate. Accordingly, the thicker encapsulant material may be much less inclined to delaminate, and thus the combination of mold flow channels and encapsulant may eliminate or reduce solder bridging between pads and/or solder weeping to the edge of the module.

The circuit module embodiments described herein may be utilized to implement any of a variety of different types of power amplifiers or other types of electronic circuitry. To provide a concrete example that will help to convey the details of the inventive subject matter, an example of a Doherty power amplifier module is utilized herein (i.e., a circuit module that includes Doherty power amplifier circuitry). However, those of skill in the art will understand, based on the description herein, that the inventive subject matter may be utilized in power amplifier modules that include other types of amplifier circuitry, and/or in electronic circuit modules other than power amplifier modules. Accordingly, the use of a Doherty power amplifier in the example embodiments below is not meant to limit application of the inventive subject matter only to Doherty power amplifier modules, as the inventive subject matter may be used in other types of power amplifier or electronic circuit modules, as well.

FIG. 1 is a top view of a circuit module 100 that embodies Doherty power amplifier circuitry, in accordance with an example embodiment. To enhance understanding, FIG. 1 should be viewed simultaneously with FIG. 2, which is a top exterior view of module 100, in accordance with an example embodiment. In addition, FIG. 1 should be viewed simultaneously with FIG. 3, which is a cross-sectional side view of an embodiment of module 100 of FIG. 1 along line 3-3, and with FIGS. 4 and 5, which are exterior side views of two embodiments of module 100, 100'.

Essentially, circuit module 100 includes a Doherty power amplifier implemented with a multi-layer module substrate 110, a plurality of power transistor dies 133, 134, 153, 154, and other electrical components. In addition, according to various embodiments, circuit module 100 includes a plurality of terminal interposers 141, 142, 143, 144, 145, 146, 147, each of which includes one or more terminals (e.g., terminals 112, 114, 148, 167) for conveying signals or bias voltages, or for connecting to ground references, as will be discussed in detail below.

Figures 2, 3:
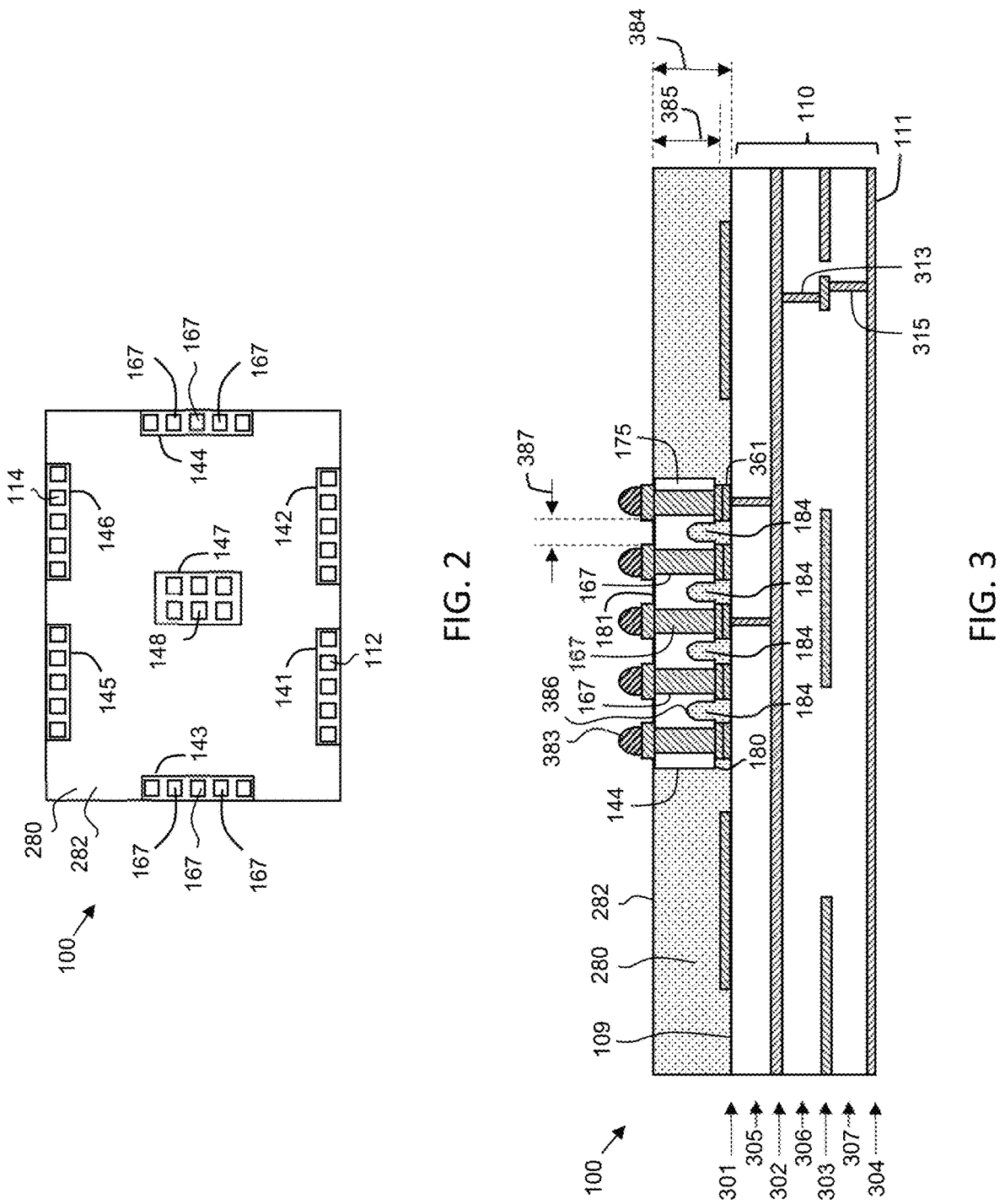
FIG. 2 depicts the contact surface of a circuit module, in accordance with an example embodiment.
FIG. 3 is a cross-sectional, side view of the circuit module of FIG. 1 along line 3-3.

As best understood with reference to FIG. 3, circuit module 100 includes a module substrate 110 in the form of a multiple-layer printed circuit board (PCB) or other suitable substrate. The module substrate 110 has a top surface 109 (also referred to as a "front-side" or "mounting surface") and a bottom surface 111 (also referred to as a "back-side" or "heat sink attachment surface"). Further, the module substrate 110 has first, second, third, and fourth sides 191, 192, 193, 194. A plurality of components and the terminal interposers 141-147 are coupled to the mounting surface 109 of the module substrate 110, and non-conductive encapsulant material 280 (FIGS. 2-5, e.g., a plastic encapsulant or molding compound) is disposed on all or at least a portion of the mounting surface 109 and over and around the components and terminal interposers 141-147 to define a top surface 282 (FIGS. 2-5, also referred to as a "contact surface") of the module 100. The encapsulant material 280 has a thickness 384 that is greater than the maximum height of the components (e.g., splitter 120, power transistor dies 133, 134, 153, 154, and terminal interposers 141-147) that are covered by the encapsulant material 280. In some embodiments, the thickness 384 is about equal to the height 385 of the terminal interposers 141-147, although the thickness 384 may be slightly less or greater than the height 385 of the interposers 141-147, in other embodiments.

As will be described in greater detail in conjunction with FIGS. 6-8, each of the terminal interposers 141-147 includes a dielectric body 175 (or 675, 775, 875) and one or more embedded terminals (e.g., terminals 112, 114, 148, 167, 611-615, 711-720, 811-820). Lower or proximal surfaces of the terminal interposers 141-147, and more particularly proximal ends of the terminals embedded within the terminal interposers 141-147, are coupled to conductive features (e.g., pads 361, FIG. 3) on the mounting surface 109 of the module substrate 110. Upper or distal surfaces of the terminal interposers 141-147, and more particularly distal ends of the terminals, are exposed at the contact surface 282 of the circuit module 100 (i.e., the top surface of the encapsulant material 280). In other embodiments, encapsulant material 280 may be present over the upper surfaces of the terminal interposers 141-147, and the distal ends of the terminals may be exposed through openings in the overlying encapsulant material 280.

In various embodiments, some of the terminal interposers 141-146 are "peripheral" terminal interposers, each of which is proximate to one of the sides 191-194 of the module substrate 110. More particularly, one or more of the peripheral terminal interposers 141-146 has a side surface (e.g., side surface 176, FIGS. 1 and 4) that is co-planar with (and/or parallel with) one of the sides 191-194 of the module substrate 110. Accordingly, terminal interposers 141-146 may be referred to herein as "peripheral" terminal interposers based on their proximities to the periphery of module 100. Each of the peripheral terminal interposers 141-146 may have a substantially similar or identical structure, although their structures may differ, as well. Further, as most clearly shown in FIG. 4, the side surface (e.g., side surface 176) of each peripheral terminal interposer 141-146 may be exposed at the side (e.g., side 193) of the module 100.

In contrast, terminal interposer 147 may be referred to as an "interior" terminal interposer based on it being located more centrally within the module 100 (e.g., not proximate to any of the sides 191-194). According to an embodiment, interposer 147 is a "shield/ground" interposer, which is coupled to the mounting surface 109 of the module substrate 110 between the carrier and peaking amplifiers 132, 152. The shield/ground interposer 147 provides a continuous or substantially continuous, electrically-conductive "wall", which functions to shunt electromagnetic energy produced by the driver-and/or final-stage dies 133, 134, 153, 154 (and/or wirebonds or other conductors coupled to those dies) to ground. Accordingly, the shield/ground interposer 147 may improve amplifier performance by reducing electromagnetic coupling between the carrier and peaking amplifiers 132, 152.

Various features and embodiments of the terminal interposers 141-147 and their embedded terminals will be discussed in more detail later in conjunction with FIGS. 6-8. Briefly, as shown in the cross-sectional view of FIG. 3, an example terminal interposer 144 includes a dielectric body 175 and a plurality of terminals 167 embedded within the dielectric body 175. Although terminal interposer 144 is shown to include five terminals 167, in other embodiments, a terminal interposer may include as few as one terminal, two terminals, or more than five terminals (e.g., up to 20 or more terminals). According to an embodiment, the physical distance (e.g., distance 387, FIG. 3) between a side of a first terminal and a nearest side of a second terminal is less than twice the width of each terminal. The term "adjacent to," in the context of terminals within terminal interposers 141-147, means that no other terminals or intervening electrical structures are present between two terminals. Instead, only material of the dielectric body 175 of the terminal interposer is present between adjacent terminals.

Figures 4, 5:
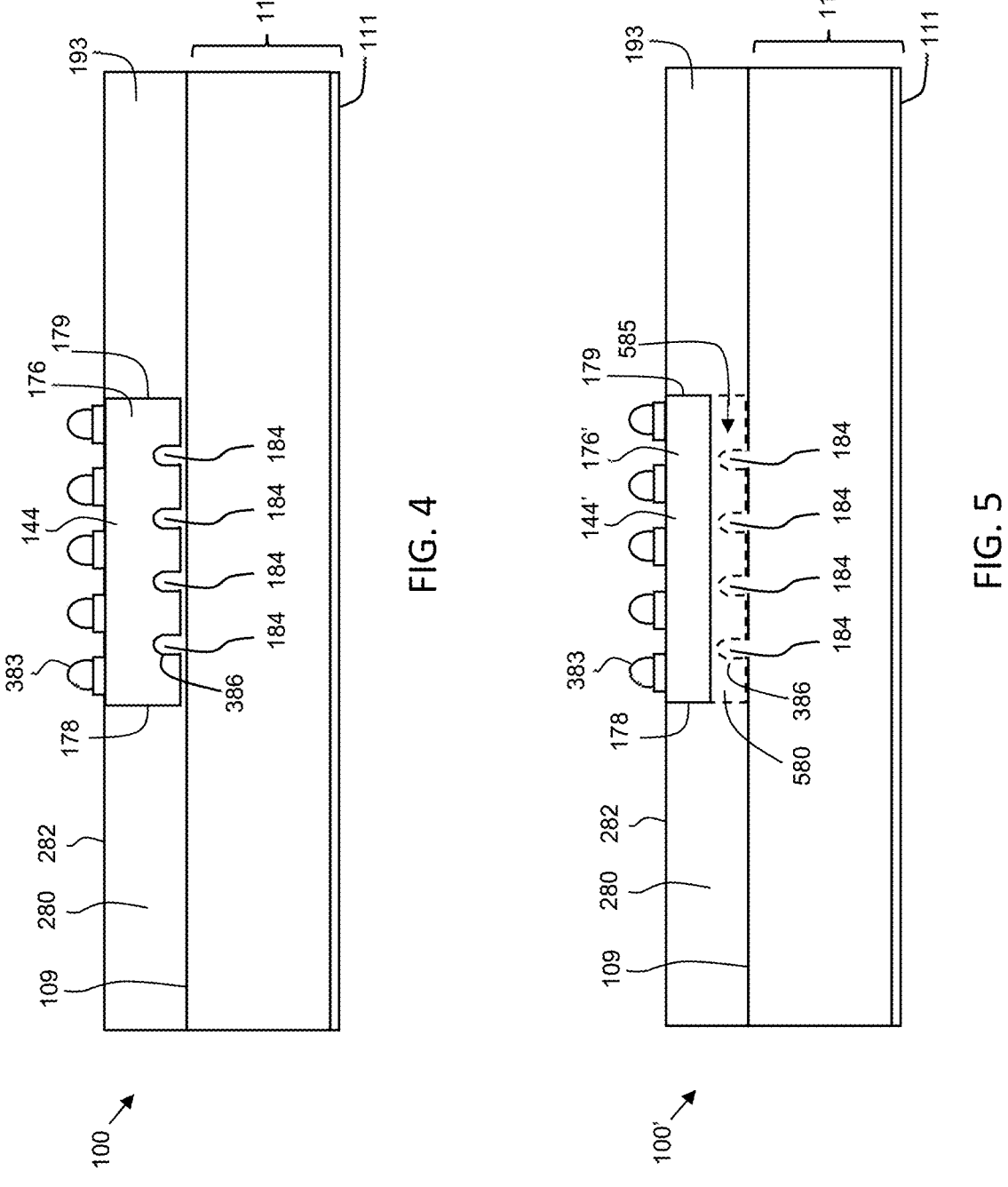
FIG. 4 is an exterior, side view of the circuit module of FIG. 1, showing a terminal interposer with mold flow channels, in accordance with an example embodiment.
FIG. 5 is an exterior, side view of the circuit module of FIG. 1, showing a terminal interposer with mold flow channels, in accordance with another example embodiment.

In addition, as shown in FIG. 4 and indicated with dashed lines in FIG. 1, terminal interposer 144 includes a plurality of mold flow channels 184 extending into and/or through the dielectric body 175 in a direction that is perpendicular to sides 176, 177 of the terminal interposer 144. More specifically, each of the mold flow channels 184 extends through the dielectric material of the dielectric body 175 between a set of adjacent, embedded, conductive terminals 167. As shown in FIG. 3, the mold flow channels 184 may be located at and open at a bottom surface 180 of the dielectric body 175, in some embodiments. In other embodiments, the mold flow channels may be located at and open at a top surface 181 of the dielectric body 175 and/or between the top and bottom surfaces 181, 180 of the dielectric body 175. Either way, and according to various embodiments, the encapsulant material 280 that overlies the mounting surface 109 of the module substrate 110 also extends into the mold flow channels 184 of the terminal interposer 144 (and into similar mold flow channels of terminal interposers 141-143, 145-147, 600, 700, 800).

The combination of the mold flow channels 184 and the encapsulant material 280 within the mold flow channels 184 may ensure a more robust and solid connection of the terminal interposer 144 to the module substrate 110. As mentioned above, during various solder reflow processes to which the module 100 is subjected, the combination of encapsulant material 280 and mold flow channels 184 may eliminate or reduce delamination (i.e., separation of the terminal interposers 141-147 from the mounting surface 109 of the module substrate 110), and thus the combination may eliminate or reduce solder bridging between module substrate pads (e.g., pads 361) during the solder reflow processes.

According to an embodiment, and as best shown in the top view of FIG. 1 and the exterior side view of FIG. 4, mold flow channels 184 (and the encapsulant material 280 within channels 184) may extend all the way through the terminal interposer 144 from a first side 177 of the terminal interposer 144 to a second side 176 of the terminal interposer 144, and thus the mold flow channels 184 extend from an interior portion of the module 100 to the side 193 of the module 100. In such an embodiment, the curved interior surface 386 of each mold flow channel 184 can be seen at the side 193 of the module 100.

The mold flow channels 184 are bounded by the mounting surface 109 of the module substrate 110, and the interior surface 386 of each of the mold flow channels. The encapsulant material 280 within the mold flow channels 184 contacts portions of the mounting surface 109 underlying the mold flow channels 184, and the interior surface 386 of each of the mold flow channels 184.

As shown in the side exterior view of FIG. 5, in an alternate embodiment of module 100', an alternate embodiment of a peripheral terminal interposer 144' may include the above-described first mold flow channels 184, along with one or more second mold flow channels 585 that extend perpendicularly to the first mold flow channels 184. More particularly, the second mold flow channel(s) 585 extend partially or all the way through the dielectric body of the terminal interposer 144' between a third side 178 of the terminal interposer 144' and a fourth side 179 of the terminal interposer 144'. In other words, the second mold flow channel(s) 585 extend in a direction that is perpendicular to the first mold flow channels 184, and thus parallel to the side (e.g., side 193) of the module 100' to which the terminal interposer is proximate. As shown in FIG. 5, a mold flow channel 585 may be positioned at the side 176' of the terminal interposer 144' so that encapsulant material 280 extends along the bottom half of the entire terminal interposer 144' at the side 193 of the module 100'. In other words, the encapsulant material 280 includes a portion 580 that extends through the second mold flow channel 585 and has an edge that is co-planar with the side 193 of the module 100' and with the first side 176' of the dielectric body of the terminal interposer 144'. The additional encapsulant material 280 within the mold flow channel 585 along the side 193 of the module 100' may further reduce the possibility of delamination at the side 193 of the module 100', and thus the encapsulant material 280 within the mold flow channel 585 may reduce or eliminate solder weeping to the side 193 of the module 100'.

In this embodiment, only the upper portion of the side 176' of the terminal interposer 144' is exposed at the side 193 of the module 100'. As shown with dashed lines, the first mold flow channels 184 are recessed behind the encapsulant material 280 within mold flow channel 585.

For both modules 100, 100', conductive attachment material 383 (e.g., solder balls, solder paste, or conductive adhesive) is disposed on the exposed distal ends of the terminals 112, 148, 114, 167 to facilitate electrical and mechanical attachment of the module 100 to a system substrate (e.g., system substrate 1010, FIG. 10), as will be described in more detail later.

Referring again to FIG. 3, the module substrate 110 includes a plurality of dielectric layers 305, 306, 307 (e.g., formed from FR-4, ceramic, or other PCB dielectric materials), in an alternating arrangement with a plurality of conductive layers 301, 302, 303, 304, where a top surface 109 of the module substrate 110 is defined by a patterned conductive layer 301, and a bottom surface 111 of the module substrate 110 is defined by a conductive layer 304. It should be noted that, although module substrate 110 is shown to include three dielectric layers 305-307 and four conductive layers 301-304, other embodiments of a module substrate may include more or fewer dielectric layers and/or conductive layers.

Each of the various conductive layers 301-304 may have a primary purpose, and also may include conductive features that facilitate signal and/or voltage/ground routing between other layers. For example, in an embodiment, the patterned conductive layer 301 at the mounting surface 109 of the module substrate 110 may primarily function as a signal conducting layer. More specifically, layer 301 includes a plurality of conductive features (e.g., conductive pads 361 and traces), which serve as attachment points for the terminals of the terminal interposers 141-147 and other discrete components, and also provide electrical connectivity between the dies 133, 134, 153, 154 and the other discrete components. Conductive layers 302, 303 may function as RF ground and routing layers, in various embodiments. Finally, conductive layer 304 may functions as a system ground layer and also as a heat sink attachment layer, as will be explained in more detail in conjunction with FIG. 10.

According to an embodiment, module substrate 110 also includes one or more thermal dissipation structures 116 (FIG. 1), which extend between the top and bottom surfaces 109, 111 of the module substrate 110. The dies 133, 134, 153, 154 are physically and electrically coupled to surfaces of the thermal dissipation structures 116 that are exposed at the top surface 109 of the module substrate 110. The top surfaces of the thermal dissipation structures 116 are considered, for purposes of this disclosure, to form portions of the mounting surface 109 of the substrate 110 (i.e., the dies 133, 134, 153, 154 are coupled both to the mounting surface 109 and to the thermal dissipation structures 116). The bottom surfaces of the thermal dissipation structures 116 may be exposed at the bottom surface 111 of the module substrate 110, or the bottom surfaces of the thermal dissipation structures 116 may be covered with the bottom conductive layer 304. Either way, the thermal dissipation structures 116 are configured to provide a thermal pathway between the dies 133, 134, 153, 154 and the bottom surfaces of the thermal dissipation structures 116 (and thus the bottom surface 111 of the module substrate 110). In various embodiments, the thermal dissipation structures 116 may include conductive metallic coins that are press-fit and/or attached into through-holes that extend between the surfaces 109, 111 of the module substrate 110. In alternate embodiments, each of the thermal dissipation structures 116 may include a plurality (or set) of conductive thermal vias (e.g., circular or bar vias) that extend between the surfaces 109, 111 of the module substrate 110. As will be described in more detail in conjunction with FIG. 10, exposed bottom surfaces of the thermal dissipation structures 116 (or the portion of the conductive layer 304 overlying those surfaces) are physically and thermally coupled to a heat sink (e.g., heat sink 1016, FIG. 10) when the module 100 is integrated within a larger electrical system.

Referring again to FIG. 1, the circuit module 100 further includes the Doherty power amplifier circuitry. More specifically, the circuit module 100 includes an RF signal input terminal 112, a power splitter 120, a two-stage, carrier amplifier 132, a two-stage peaking amplifier 152, various phase shift and impedance matching elements, a combining node 172, an output impedance matching network 174, and an RF signal output terminal 114. The RF signal input terminal 112 and the RF signal output terminal 114 each include a conductive terminal that is embedded in one of terminal interposers 141, 146. Additional terminals 167 designated to provide bias voltages to the dies 133, 134, 153, 154 are embedded within terminal interposers 143, 144.

Terminal 112 functions as the RF signal input terminal for the module 100. According to an embodiment, terminal 112 is embedded within terminal interposer 141, and is coupled to an RF signal input pad (not illustrated, but similar to pad 361, FIG. 3) at the mounting surface 109 of the module substrate 110. Through one or more conductive structures (e.g., vias, traces, and/or wirebonds, as shown), the RF signal input pad is electrically coupled to an input 122 to the power splitter 120.

The power splitter 120, which is coupled to the mounting surface 109 of the system substrate 110, may include one or more discrete die and/or components, although it is represented in FIG. 1 as a single element. The power splitter 120 includes an input terminal 122 and two output terminals (not numbered). The input terminal 122 is electrically coupled through one or more conductive structures (e.g., vias, traces, and/or wirebonds, as shown) to the RF signal input pad and to the RF signal input terminal 112, and thus is configured to receive an input RF signal. The output terminals of the power splitter 120 are electrically coupled through one or more conductive structures (e.g., vias, traces, and/or wirebonds) and input circuits 131, 151 to inputs 135, 155 for the carrier and peaking amplifiers 132, 152, respectively.

The power splitter 120 is configured to split the power of the input RF signal received through the RF input terminal 112 into first and second RF signals, which are produced at the output terminals of the power splitter 120. In addition, the power splitter 120 may include one or more phase shift elements configured to impart about a 90 degree phase difference between the RF signals provided at the splitter output terminals.

The first output of the power splitter is electrically coupled to a carrier amplifier path 132, and the second output of the power splitter is electrically coupled to a peaking amplifier path 152. The first RF signal (or carrier signal) produced by the power splitter 120 is amplified through the carrier amplifier path 132, and the second RF signal (or peaking signal) produced by the power splitter 120 is amplified through the peaking amplifier path 152.

In the specific embodiment of FIG. 1, each of the carrier and peaking amplifier paths includes a two-stage power amplifier 132, 152, where a driver-stage transistor 136, 156 is implemented on a driver-stage die 133, 153, and a final-stage transistor 137, 157 is implemented on a separate final-stage die 134, 154. In other embodiments, each of the carrier and peaking amplifiers 132, 152 may include a two-stage power amplifier implemented on a single die, or each of the carrier and peaking amplifiers 132, 152 may include a single-stage power amplifier implemented on a single die. For example, each of the transistors 136, 137, 156, 157 may be field effect transistors (FETs), such as laterally-diffused metal oxide semiconductor (LDMOS) FETs or high electron mobility transistors (HEMTs). The description and claims may refer to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

The carrier amplifier path includes the above-mentioned driver stage die 133, the final-stage die 134, and a phase shift and impedance inversion element 170. The driver stage die 133 and the final-stage die 134 of the carrier amplifier path 132 are electrically coupled together in a series arrangement between an input terminal 135 of the driver stage die 133 (corresponding to a carrier amplifier input) and an output terminal 138 of the final-stage die 134 (corresponding to a carrier amplifier output).

The driver stage die 133 includes power transistor 136. The gate of the transistor 136 is electrically coupled to the input terminal 135, and the drain of the transistor 136 is electrically coupled to the output terminal of die 133. The source of transistor 136 is electrically coupled to a conductive layer (or source terminal) on a bottom surface of die 133, and the bottom conductive layer is physically, electrically, and thermally coupled to the exposed top surface of a thermal dissipation structure 116.

The output terminal of the driver stage die 133 is electrically coupled to the input terminal of the final-stage die 134 through a wirebond array (not numbered) or another type of electrical connection. The final-stage die 134 also includes a power transistor 137, and an output terminal 138. The gate of the transistor 137 is electrically coupled to the input terminal of die 134, and the drain of the transistor 137 is electrically coupled to the output terminal 138 of die 134. The source of transistor 137 is electrically coupled to a conductive layer on a bottom surface of die 134, and the bottom conductive layer is physically, electrically, and thermally coupled to the exposed top surface of another thermal dissipation structure 116.

The peaking amplifier path includes the above-mentioned driver stage die 153 and the final-stage die 154. The driver stage die 153 and the final-stage die 154 of the peaking amplifier path 152 are electrically coupled together in a series arrangement between an input terminal 155 of the driver stage die 153 (corresponding to a peaking amplifier input) and an output terminal 158 of the final-stage die 154 (corresponding to a peaking amplifier output).

The driver stage die 153 includes a plurality of integrated circuits. In an embodiment, the integrated circuitry of die 153 includes a series-coupled arrangement of the input terminal 155, an input impedance matching circuit (not numbered), a power transistor 156, an integrated portion of an interstage impedance matching circuit (not numbered), and an output terminal not numbered, in an embodiment. More specifically, the gate of the transistor 156 is electrically coupled through the input impedance matching circuit to the input terminal 155, and the drain of the transistor 156 is electrically coupled through the output impedance matching circuit to the output terminal of die 153. The source of transistor 156 is electrically coupled to a conductive layer on a bottom surface of die 153, and the bottom conductive layer is physically, electrically, and thermally coupled to the exposed top surface of a thermal dissipation structure 116.

The output terminal of the driver stage die 153 is electrically coupled to the input terminal of the final-stage die 154 through a wirebond array (not numbered) or another type of electrical connection. The final-stage die 154 also includes a plurality of integrated circuits. In an embodiment, the integrated circuitry of die 154 includes a series-coupled arrangement of an input terminal (not numbered), a power transistor 157, and an output terminal 158. More specifically, the gate of the transistor 157 is electrically coupled to the input terminal of die 154, and the drain of the transistor 157 is electrically coupled to the output terminal 158 of die 154. The source of transistor 157 is electrically coupled to a conductive layer on a bottom surface of die 154, and the bottom conductive layer is physically, electrically, and thermally coupled to the exposed top surface of a thermal dissipation structure 116. As mentioned previously, bottom surfaces of the thermal dissipation structures 116 are coupled to conductive layer 304 at the bottom surface 111 of the module substrate 110.

For proper Doherty operation, the carrier amplifier 132 may be biased to operate in a class AB mode, and the peaking amplifier 152 may be biased to operate in a class C mode. To accomplish this biasing, a plurality of gate and drain bias voltages may be provided by external bias voltage sources. According to an embodiment, the bias voltages are provided through bias terminals 167 embedded within one or more additional terminal interposers 143, 144. More specifically, gate and drain bias voltages for the transistors 136, 137, 156, 157 may be provided through bias terminals 167.

During operation, an amplified carrier signal is produced at the output terminal 138 of the final-stage die 134, and an amplified peaking signal is produced at the output terminal 158 of the final-stage die 154, which also functions as the combining node 172 for the amplifier. According to an embodiment, the output terminal 138 of the carrier final-stage die 134 is electrically coupled (e.g., through wirebonds (not numbered) or another type of electrical connection) to a first end of the phase shift and impedance inversion element 170, and the output terminal 158 of the peaking final-stage die 154 is electrically coupled (e.g., through wirebonds (not numbered) or another type of electrical connection) to a second end of the phase shift and impedance inversion element 170.

According to an embodiment, the phase shift and impedance inversion element 170 may be implemented with a quarter-wavelength or lambda/4 (2/4) or shorter transmission line (e.g., a microstrip transmission line with an electrical length up to about 90 degrees) that is formed from a portion of the conductive layer 301. The combination of the phase shift and impedance inversion element 170 and the wirebond (or other) connections to the output terminals 138, 158 of dies 134, 154 may impart about a 90 degree relative phase shift to the amplified carrier signal as the signal travels from output terminal 138 to output terminal 158/combining node 172. When the various phase shifts imparted separately on the carrier and peaking RF signals through the carrier and peaking paths, respectively, are substantially equal, the amplified carrier and peaking RF signals combine substantially in phase at output terminal 158/combining node 172.

The output terminal 158/combining node 172 is electrically coupled (e.g., through wirebonds or another type of electrical connection) through an output impedance matching network 174 to RF output terminal 114. The output impedance matching network 174 functions to present the proper load impedances to each of carrier and peaking final-stage dies 134, 154. Although shown in a highly simplified form in FIG. 1, the output impedance matching network 174 may include various conductive traces, additional discrete components (e.g., capacitors, inductors, and/or resistors) between output terminal 158/combining node 172 and RF output terminal 114, which provide the desired impedance matching.

Terminal 114 functions as the RF signal output terminal for the module 100. According to an embodiment, terminal 114 is embedded within terminal interposer 146, and is coupled to an RF signal output pad (not illustrated) at the mounting surface 109 of the module substrate 110.

In the example module 100 of FIG. 1, one or two perimeter interposers 141-146 are positioned at each of the four sides 191-194 of the substrate 110. Although each of the perimeter interposers 141-146 are shown to be identical in module 100, in other embodiments, the various perimeter interposers 141-146 may be different. Further still, although each of the perimeter interposers 141-146 are shown to include a single row of five terminals, some of the perimeter interposers 141-146 may have more terminals (e.g., up to 20 terminals or more), fewer terminals (e.g., as few as one terminal), and/or a different number of terminal rows.

For ease of illustration and understanding, FIG. 1 depicts module 100 with encapsulant material 280 removed. A depiction of the contact surface 282 of circuit module 100 that includes the encapsulant material 280 is illustrated in FIG. 2. More specifically, FIG. 2 illustrates the contact surface 282 of the encapsulant material 280, at which the distal ends of terminals 112, 114, 148, 167 are exposed, essentially as a land grid array (LGA) of conductive contact pads. FIG. 2 also indicates the placement of terminal interposers 141-147 at or below the contact surface 282.

Various embodiments of terminal interposers that may be suitable for terminal interposers 141-147 of the module 100 of FIG. 1 will now be discussed in conjunction with FIGS. 6-8. For example, FIG. 6 illustrates a top view 601, a bottom view 604, and two side cross-sectional views 602, 603 (along lines 602-602, 603-603, respectively) of an embodiment of a terminal interposer 600. FIG. 6 more specifically illustrates an interposer 600 that includes a single row 671 of interposer terminals 611-615 embedded in a dielectric body 675. Although the row 671 of interposer terminals in FIG. 6 includes five terminals, in other embodiments, a row of interposer terminals may include more or fewer terminals (e.g., each row may include from one to 20 terminals or more).

The dielectric body 675 has top and bottom surfaces 680, 681. First, second, third, and fourth side surfaces 676-679 of the dielectric body 675 extend between the top and bottom surfaces 680, 681, where the first and second side surfaces 676, 677 are parallel, and the third and fourth side surfaces 678, 679 are parallel. The length 630 of the dielectric body 675 may be in a range of about 2500 microns to about 10,000 microns, the width 631 of the dielectric body 675 may be in a range of about 500 microns to about 2000 microns, and the height 632 of the dielectric body 675 may be in a range of about 500 microns to about 2000 microns. Alternatively, the length 630, width 631, and/or height 632 may be smaller or larger than the above-given ranges.

Electrically conductive terminals 611-615 are embedded within the dielectric body 675. Each terminal 611-615 includes a conductive via 640 extending through the dielectric body 675 between its top and bottom surfaces 680, 681. As will be described in further detail in conjunction with FIG. 9, each conductive via 640 may be formed from a conductive liner (e.g., liner 909, FIG. 9) on the sidewalls of a through hole (e.g., hole 905, FIG. 9) in the dielectric body 675, which is filled with conductive fill material (e.g., fill material 911, FIG. 9). According to an embodiment, each conductive via 640 is fully surrounded by the dielectric material of the dielectric body 675, except at its ends, which are exposed at the top or bottom surface 680, 681 of the dielectric body 675. Further, dielectric material of the dielectric body 675 is present between and electrically separates adjacent conductive vias 640 (i.e., the terminals 611-615 are separated by dielectric material).

Figure 6:
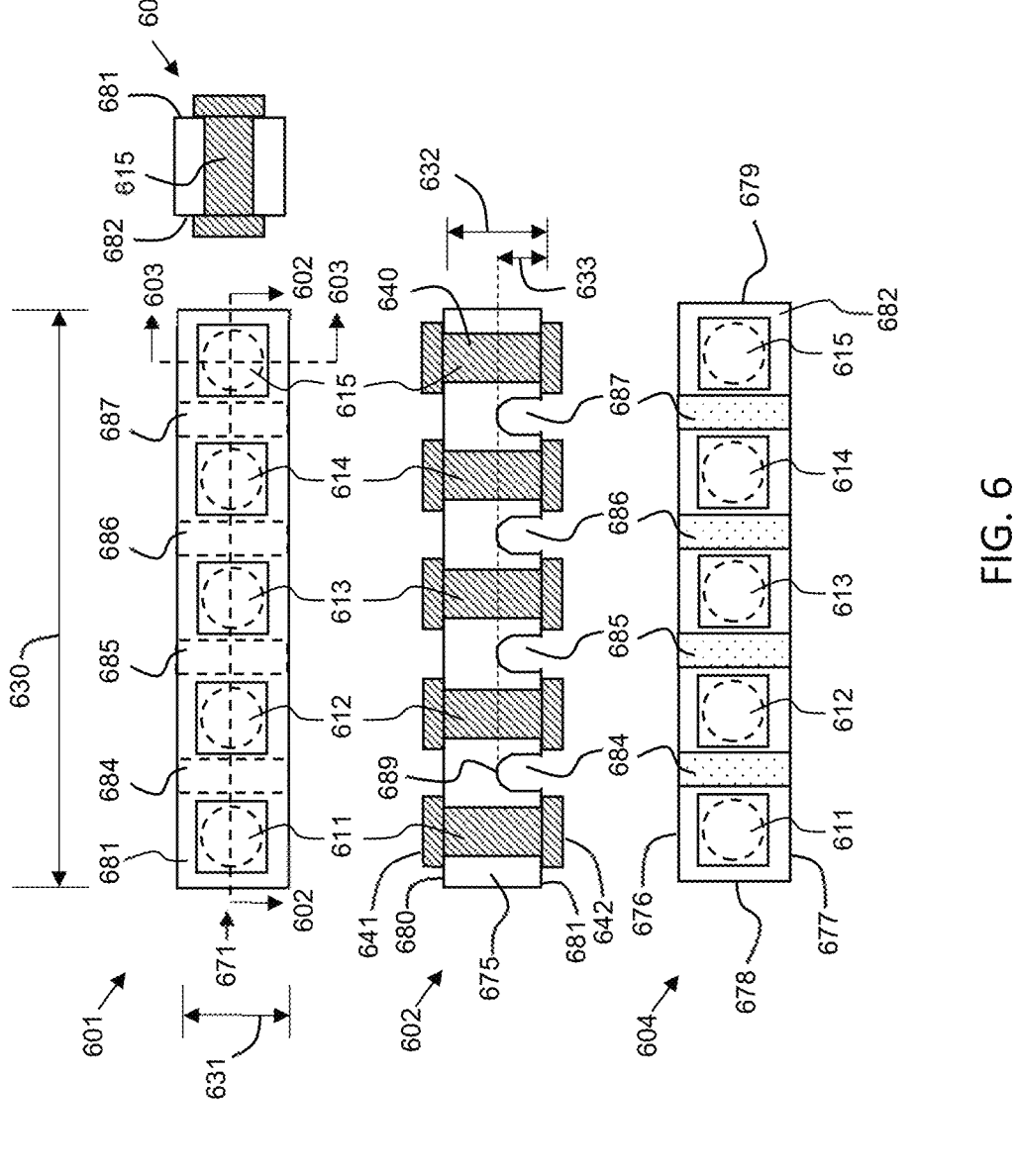
FIG. 6 includes top, bottom, and two side cross-sectional views of a terminal interposer with mold flow channels, in accordance with an embodiment.

As indicated in FIG. 6, each conductive via 640 may have a circular cross-sectional shape. However, in other embodiments, each conductive via 640 alternatively may have a square, rectangular, or bar shape. When each via 640 has a square or circular cross-section, the via 640 may have a cross-sectional diameter (or width) in a range of about 300 microns to about 800 microns (e.g., about 500 microns), although the diameter may be smaller or larger, as well.

Conductive pads 641, 642 are deposited on the top and bottom surfaces 680, 681 in contact with first and second ends (or proximal and distal ends), respectively, of each conductive via 640. As will be described in further detail in conjunction with FIG. 9, each conductive pad 641, 642 may be at least partially formed from a conductive cap (e.g., cap 913, FIG. 9) that is connected to the conductive via 640 at the top and bottom surfaces 680, 681 of the dielectric body 675.

A plurality of mold flow channels 684-687 extend through the dielectric material of the dielectric body 675, according to various embodiments. As shown in FIG. 6, the mold flow channels 684-687 extend all the way through the dielectric body 675 between the parallel first and second surfaces 676, 677. In other words, the mold flow channels 684-687 extend through the dielectric body 675 in a direction that is perpendicular to the first and second surfaces 676, 677. In alternate embodiments, the mold flow channels may extend only part way through the dielectric body 675.

In the embodiment shown in FIG. 6, a mold flow channel 684-687 is formed in the dielectric body 675 between each set of adjacent terminals 611/612, 612/613, 613/614, 614/615. Accordingly, for first and second adjacent terminals 611, 612, the first terminal 611 is located at a first side of mold flow channel 684, and the second terminal 612 is located at a second side of mold flow channel 684. In other words, each set of adjacent terminals 611/612, 612/613, 613/614, 614/615 is separated by an intermediate portion of the dielectric body 675, and each mold flow channel 684-687 extends through one of the intermediate portions of the dielectric body 675 between the adjacent terminals 611/612, 612/613, 613/614, 614/615.

According to various embodiments, the mold flow channels 684-687 are open along and extend upward into the dielectric body 675 from the bottom surface 681. Each of the mold flow channels 684-687 is defined by an interior surface 689, which may have any of various shapes. For example, in the embodiment of FIG. 6, the interior surface 689 has vertical sidewalls and a curved upper extent. In other embodiments, the interior surface may have vertical sidewalls and a flat upper extent. Either way, the height 633 of each mold flow channel 684-687 (i.e., the distance between the bottom surface 681 and the upper extent of the channel 684-687) may be in a range of about 10 percent to about 75 percent (or about 20 percent to about 60 percent) of the height 632 of the dielectric body 675.

Terminal interposer 600 may be utilized for any of the terminal interposers 141-147 of FIG. 1. To incorporate the terminal interposer 600 into a module (e.g., module 100, FIG. 1), the conductive pads 642 on the bottom surface 681 of the dielectric body 675 may be soldered or otherwise attached to one or more conductive pads (e.g., pads 361, FIG. 3) on the surface of a module substrate, and those pads may be electrically coupled to one or more of the conductive layers 301-304 of the module substrate. Terminal interposer 600 may be used as a peripheral terminal interposer (e.g., interposers 141-146) or as an interior terminal interposer (e.g., interposer 147). Either way, when molding compound or encapsulant material (e.g., encapsulant material 280, FIGS. 2-5) is applied over the module substrate (e.g., substrate 110) to which the terminal interposer 600 is attached, the molding compound surrounds some or all of the side surfaces (e.g., side surfaces 677-679 for a peripheral terminal interposer or all side surfaces 676-679 for an interior terminal interposer), and flows into the mold flow channels 684-687, essentially filling the mold flow channels 684-687 with molding compound.

As mentioned previously, when the interposer 600 is incorporated into a module (e.g., module 100, FIG. 1), the height 632 of the interposer 600 may be approximately equal to the thickness (e.g., thickness 384, FIG. 3) of the encapsulant material (e.g., encapsulant material 280), so that the top conductive pad 641 of each interposer terminal 611-615 may be substantially co-planar with the contact surface (e.g., surface 282, FIGS. 3-5) of the module. In other embodiments, the top conductive pad 641 of each interposer terminal may be recessed below or extend above the contact surface of the module.

The terminal interposer 600 of FIG. 6 includes only one row 671 of terminals 611-615, and mold flow channels 684-687 that extend in a single direction (i.e., between sides 676, 677). In other embodiments, a terminal interposer may include two or more rows of terminals and/or mold flow channels that extend in multiple directions.

Figure 7:
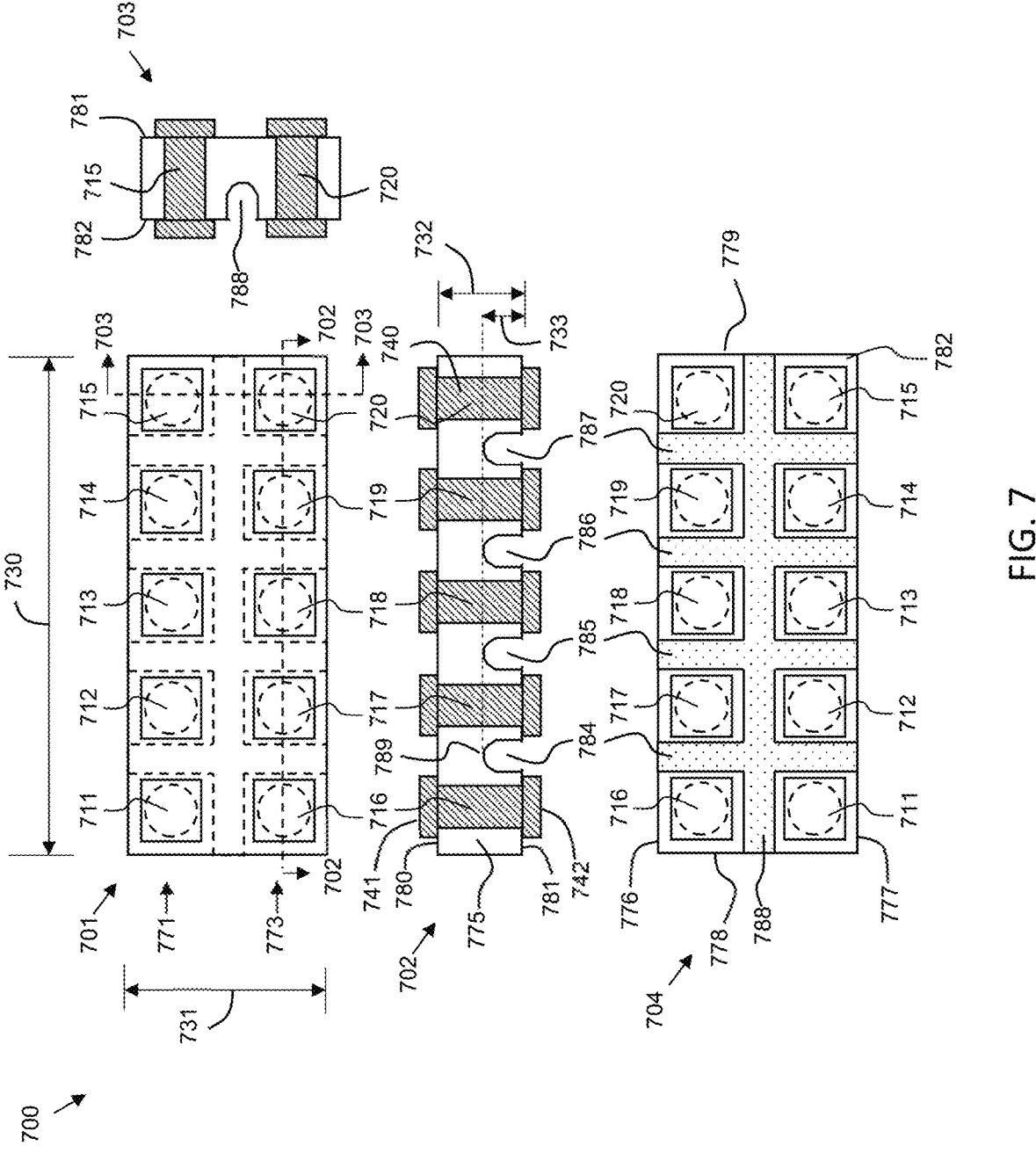
FIG. 7 includes top, bottom, and two side cross-sectional views of a terminal interposer with mold flow channels, in accordance with another embodiment.

For example, FIG. 7 illustrates a top view 701, a bottom view 704, and two side cross-sectional views 702, 703 (along lines 702-702, 703-703, respectively) of an embodiment of a terminal interposer 700. FIG. 7 more specifically illustrates an interposer 700 that includes two rows 771, 773 of interposer terminals 711-720 embedded in a dielectric body 775. Although each of the rows 771, 773 of interposer terminals in FIG. 7 includes five terminals, in other embodiments, each row of interposer terminals may include more or fewer terminals (e.g., each row may include from one to 20 terminals or more).

The dielectric body 775 has top and bottom surfaces 780, 781. First, second, third, and fourth side surfaces 776-779 of the dielectric body 775 extend between the top and bottom surfaces 780, 781, where the first and second side surfaces 776, 777 are parallel, and the third and fourth side surfaces 778, 779 are parallel. The length 730 of the dielectric body 775 may be in a range of about 2500 microns to about 10,000 microns, the width 731 of the dielectric body 775 may be in a range of about 1000 microns to about 4000 microns, and the height 732 of the dielectric body 775 may be in a range of about 500 microns to about 2000 microns. Alternatively, the length 730, width 731, and/or height 732 may be smaller or larger than the above-given ranges.

Two rows 771, 773 of electrically conductive terminals 711-720 are embedded within the dielectric body 775. Each terminal 711-720 includes a conductive via 740 extending through the dielectric body 775 between its top and bottom surfaces 780, 781. Again, as will be described in further detail in conjunction with FIG. 9, each conductive via 740 may be formed from a conductive liner (e.g., liner 909, FIG. 9) on the sidewalls of a through hole (e.g., hole 905, FIG. 9) in the dielectric body 775, which is filled with conductive fill material (e.g., fill material 911, FIG. 9). According to an embodiment, each conductive via 740 is fully surrounded by the dielectric material of the dielectric body 775, except at its ends, which are exposed at the top or bottom surface 780, 781 of the dielectric body 775. Further, dielectric material of the dielectric body 775 is present between and electrically separates adjacent conductive vias 740 (i.e., the terminals 711-720 are separated by dielectric material).

As indicated in FIG. 7, each conductive via 740 may have a circular cross-sectional shape. However, in other embodiments, each conductive via 740 alternatively may have a square, rectangular, or bar shape. When each via 740 has a square or circular cross-section, the via 740 may have a cross-sectional diameter (or width) in a range of about 300 microns to about 800 microns (e.g., about 500 microns), although the diameter may be smaller or larger, as well.

Conductive pads 741, 742 are deposited on the top and bottom surfaces 780, 781 in contact with first and second ends (or proximal and distal ends), respectively, of each conductive via 740. Again, as will be described in further detail in conjunction with FIG. 9, each conductive pad 741, 742 may be at least partially formed from a conductive cap (e.g., cap 913, FIG. 9) that is connected to the conductive via 740 at the top and bottom surfaces 780, 781 of the dielectric body 775.

A plurality of first mold flow channels 784-787 extend in a first direction through the dielectric material of the dielectric body 775, according to various embodiments. In addition, a second mold flow channel 788 extends in a second direction (perpendicular to the first direction) through the dielectric material of the dielectric body 775. As shown in FIG. 7, the first mold flow channels 784-787 extend all the way through the dielectric body 775 between the parallel first and second surfaces 776, 777. In other words, the mold flow channels 784-787 extend through the dielectric body 775 in a direction that is perpendicular to the first and second surfaces 776, 777. In contrast, the second mold flow channel 788 extends all the way through the dielectric body 775 between the parallel third and fourth surfaces 778, 779. In other words, the mold flow channel 788 extend through the dielectric body 775 in a direction that is perpendicular to the third and fourth surfaces 778, 779. In alternate embodiments, some or all of the mold flow channels may extend only part way through the dielectric body 775.

In the embodiment shown in FIG. 7, one of the first mold flow channels 784-787 is formed in the dielectric body 775 between each set of adjacent terminals 711/712, 712/713, 713/714, 714/715, 716/717, 717/718, 718/719, 719/720 in each row 771, 773. In addition, the second mold flow channel 788 is formed in the dielectric body 775 between the rows 771, 773, or between each set of adjacent terminals 711/716, 712/717, 713/718, 714/719, 715/720. Accordingly, for first and second adjacent terminals 711, 712 in row 771, the first terminal 711 is located at a first side of mold flow channel 784, and the second terminal 712 is located at a second side of mold flow channel 784. Similarly, for first and second adjacent terminals 711, 716 in rows 771, 773, the first terminal 711 is located at a first side of mold flow channel 788, and the second terminal 716 is located at a second side of mold flow channel 788. In other words, each set of adjacent terminals 711/712, 712/713, 713/714, 714/715, 716/717, 717/718, 718/719, 719/720, 711/716, 712/717, 713/718, 714/719, 715/720 is separated by an intermediate portion of the dielectric body 775, and each mold flow channel 784-788 extends through one of the intermediate portions of the dielectric body 775 between the adjacent terminals 711/712, 712/713, 713/714, 714/715, 716/717, 717/718, 718/719, 719/720, 711/716, 712/717, 713/718, 714/719, 715/720.

According to various embodiments, the mold flow channels 784-788 are open along and extend upward into the dielectric body 775 from the bottom surface 781. Each of the mold flow channels 784-788 is defined by an interior surface 789, which may have any of various shapes. For example, in the embodiment of FIG. 7, the interior surface 789 has vertical sidewalls and a curved upper extent. In other embodiments, the interior surface may have vertical sidewalls and a flat upper extent. Either way, the height 733 of each mold flow channel 784-788 (i.e., the distance between the bottom surface 781 and the upper extent of the channel 784-788) may be in a range of about 10 percent to about 75 percent (or about 20 percent to about 50 percent) of the height 732 of the dielectric body 775.

Terminal interposer 700 may be utilized for any of the terminal interposers 141-147 of FIG. 1. To incorporate the terminal interposer 700 into a module (e.g., module 100, FIG. 1), the conductive pads 742 on the bottom surface 781 of the dielectric body 775 may be soldered or otherwise attached to one or more conductive pads (e.g., pads 361, FIG. 3) on the surface of a module substrate, and those pads may be electrically coupled to one or more of the conductive layers 301-304 of the module substrate. Terminal interposer 700 may be used as a peripheral terminal interposer (e.g., interposers 141-146) or as an interior terminal interposer (e.g., interposer 147). Either way, when molding compound or encapsulant material (e.g., encapsulant material 280, FIGS. 2-5) is applied over the module substrate (e.g., substrate 110) to which the terminal interposer 700 is attached, the molding compound surrounds some or all of the side surfaces (e.g., side surfaces 777-779 for a peripheral terminal interposer or all side surfaces 776-779 for an interior terminal interposer), and flows into the mold flow channels 784-788, essentially filling the mold flow channels 784-788 with molding compound.

According to an embodiment, and as will be explained in more detail in conjunction with FIGS. 10-16, during parallel fabrication of a panel of multiple modules, the first row 771 of terminals 711-715 may be attached to conductive pads of a first pre-singulated module (e.g., pads 1244 of module 1201, FIG. 12), and the second row 773 of terminals 716-720 may be attached to conductive pads of a second pre-singulated module (e.g., pads 1243 of module 1203, FIG. 12). Encapsulant material (e.g., encapsulant material 280, FIGS. 2-5) may then be applied over the panel of module substrates (e.g., panel 1200, FIG. 12) to which the terminal interposer 700 is attached. The molding compound would surround all of the side surfaces of the terminal interposer 700, and flow into the mold flow channels 784-788, essentially filling the mold flow channels 784-788 with molding compound. During a singulation process (e.g., block 1108, FIG. 11), the attached terminal interposer 700 may be cut through along mold flow channel 788, which results in a first, single-row terminal interposer coupled to the first post-singulated module (e.g., module 1601, FIG.

Figure 16:
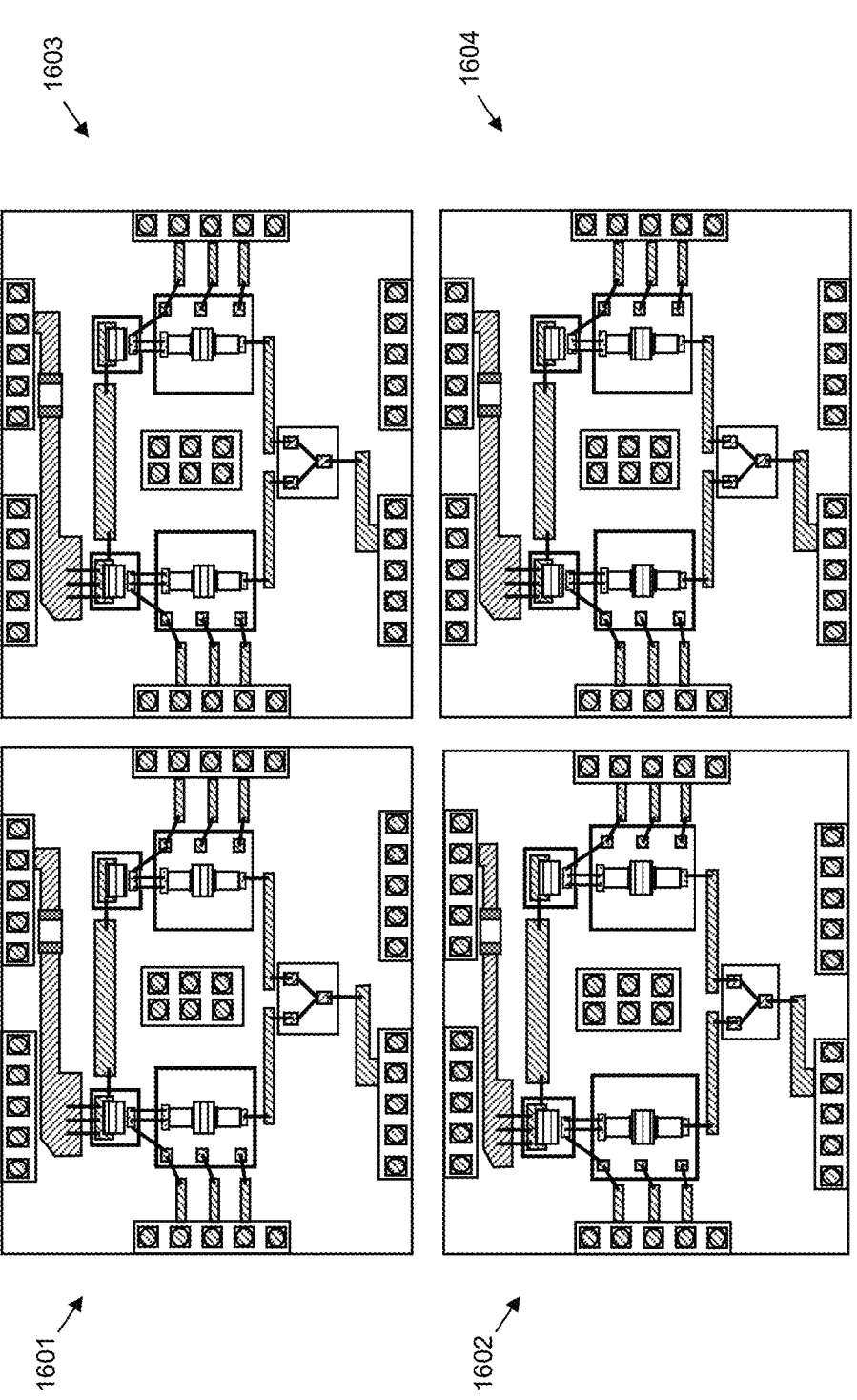
FIG. 16 is a top view of the panel of module substrates of FIG. 15 after performing a singulation operation, in accordance with an example embodiment.

16), and a second, single-row terminal interposer coupled to the second post-singulated module (e.g., module 1603, FIG. 16).

As mentioned previously, when the interposer 700 is incorporated into a module (e.g., module 100, FIG. 1), the height 732 of the interposer 700 may be approximately equal to the thickness (e.g., thickness 384, FIG. 3) of the encapsulant material (e.g., encapsulant material 280), so that the top conductive pad 741 of each interposer terminal 711-720 may be substantially co-planar with the contact surface (e.g., surface 282, FIGS. 2-5) of the module. In other embodiments, the top conductive pad 741 of each interposer terminal may be recessed below or extend above the contact surface of the module.

The terminal interposers 600, 700 of FIGS. 6 and 7 include mold flow channels 684-687, 784-788 only at the bottom surface 681, 781 of the dielectric body 675, 775. In other embodiments, a terminal interposer may include mold flow channels only at the top surface 680, 780 of the dielectric body 675, 775. Alternatively, a terminal interposer may include mold flow channels at both the bottom and top surfaces of a dielectric body.

Figure 8:
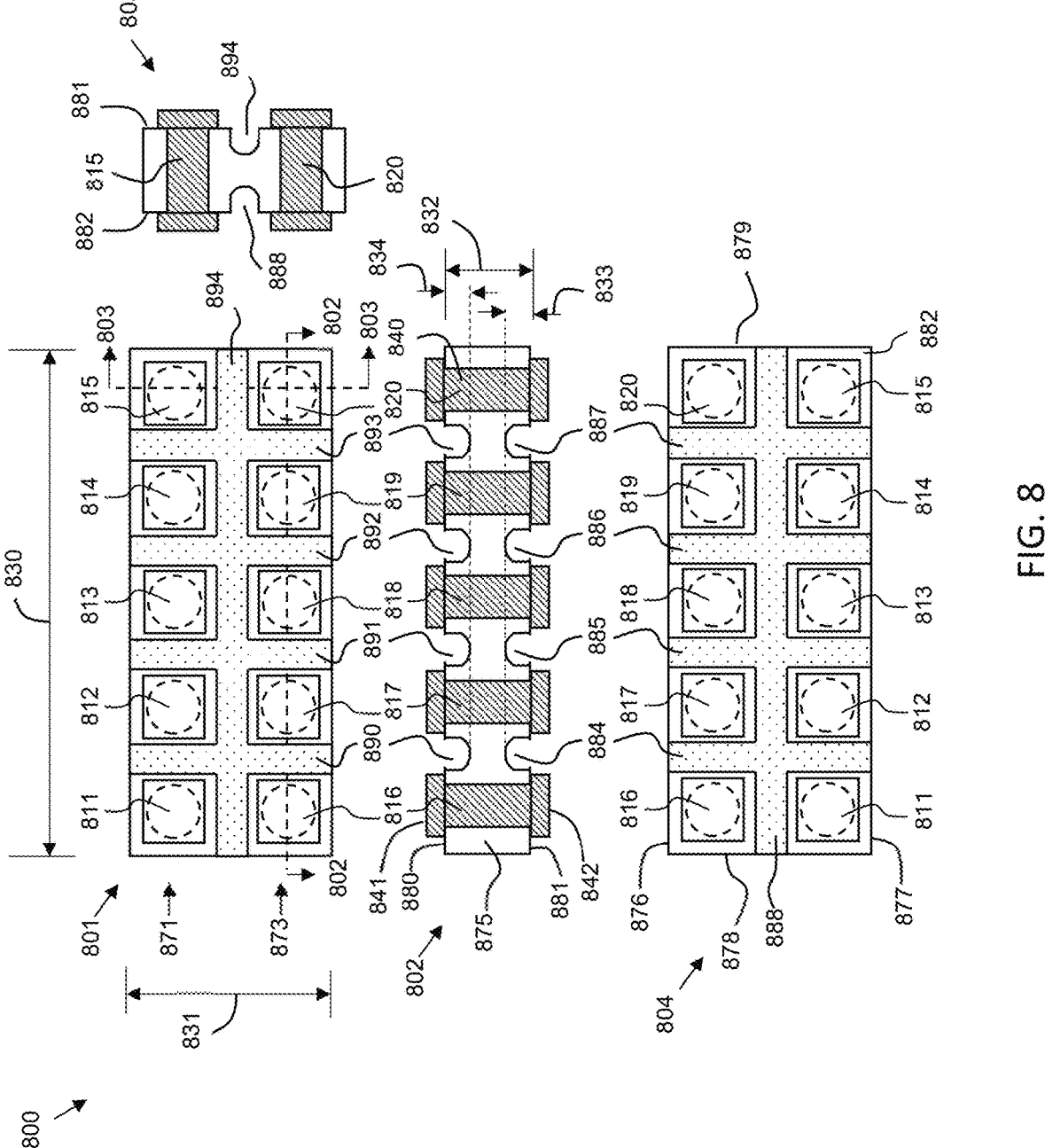
FIG. 8 includes top, bottom, and two side cross-sectional views of a terminal interposer with mold flow channels, in accordance with yet another embodiment.

For example, FIG. 8 illustrates a top view 801, a bottom view 804, and two side cross-sectional views 802, 803 (along lines 802-802, 803-803, respectively) of another embodiment of a terminal interposer 800. FIG. 8 more specifically illustrates an interposer 800 that includes two rows 871, 873 of interposer terminals 811-820 embedded in a dielectric body 875. Although each of the rows 871, 873 of interposer terminals in FIG. 8 includes five terminals, in other embodiments, each row of interposer terminals may include more or fewer terminals (e.g., each row may include from one to 20 terminals or more).

The dielectric body 875 has top and bottom surfaces 880, 881. First, second, third, and fourth side surfaces 876-879 of the dielectric body 875 extend between the top and bottom surfaces 880, 881, where the first and second side surfaces 876, 877 are parallel, and the third and fourth side surfaces 878, 879 are parallel. The length 830 of the dielectric body 875 may be in a range of about 2500 microns to about 10,000 microns, the width 831 of the dielectric body 875 may be in a range of about 1000 microns to about 4000 microns, and the height 832 of the dielectric body 875 may be in a range of about 500 microns to about 2000 microns. Alternatively, the length 830, width 831, and/or height 832 may be smaller or larger than the above-given ranges.

Two rows 871, 873 of electrically conductive terminals 811-820 are embedded within the dielectric body 875. Each terminal 811-820 includes a conductive via 840 extending through the dielectric body 875 between its top and bottom surfaces 880, 881. Again, as will be described in further detail in conjunction with FIG. 9, each conductive via 840 may be formed from a conductive liner (e.g., liner 909, FIG. 9) on the sidewalls of a through hole (e.g., hole 905, FIG. 9) in the dielectric body 875, which is filled with conductive fill material (e.g., fill material 911, FIG. 9). According to an embodiment, each conductive via 840 is fully surrounded by the dielectric material of the dielectric body 875, except at its ends, which are exposed at the top or bottom surface 880, 881 of the dielectric body 875. Further, dielectric material of the dielectric body 875 is present between and electrically separates adjacent conductive vias 840 (i.e., the terminals 811-620 are separated by dielectric material).

As indicated in FIG. 8, each conductive via 840 may have a circular cross-sectional shape. However, in other embodiments, each conductive via 840 alternatively may have a square, rectangular, or bar shape. When each via 840 has a square or circular cross-section, the via 840 may have a cross-sectional diameter (or width) in a range of about 300 microns to about 800 microns (e.g., about 500 microns), although the diameter may be smaller or larger, as well.

Conductive pads 841, 842 are deposited on the top and bottom surfaces 880, 881 in contact with first and second ends (or proximal and distal ends), respectively, of each conductive via 840. Again, as will be described in further detail in conjunction with FIG. 9, each conductive pad 841, 842 may be at least partially formed from a conductive cap (e.g., cap 913, FIG. 9) that is connected to the conductive via 840 at the top and bottom surfaces 880, 881 of the dielectric body 875.

In the embodiment of FIG. 8, mold flow channels 884-888, 890-894 are present at both the top and bottom surfaces 880, 881 of the dielectric body 875. More specifically, at the bottom surface 881 of the dielectric body 875, a plurality of first mold flow channels 884-887 extend in a first direction through the dielectric material of the dielectric body 875, and a second mold flow channel 888 extends in a second direction (perpendicular to the first direction) through the dielectric material of the dielectric body 875. In addition, at the top surface 880 of the dielectric body 875, a plurality of third mold flow channels 890-893 extend in the first direction through the dielectric material of the dielectric body 875, and a fourth mold flow channel 894 extends in the second direction (perpendicular to the first direction) through the dielectric material of the dielectric body 875. As shown in FIG. 8, the first and third mold flow channels 884-887, 890-893 extend all the way through the dielectric body 875 between the parallel first and second surfaces 876, 877. In other words, the mold flow channels 884-887, 890-893 extend through the dielectric body 875 in a direction that is perpendicular to the first and second surfaces 876, 877. In contrast, the second and fourth mold flow channels 888, 894 extend all the way through the dielectric body 875 between the parallel third and fourth surfaces 878, 879. In other words, the mold flow channels 888, 894 extend through the dielectric body 875 in a direction that is perpendicular to the third and fourth surfaces 878, 879. In alternate embodiments, some or all of the mold flow channels may extend only part way through the dielectric body 875.

In the embodiment shown in FIG. 8, at the bottom surface 881, one of the first mold flow channels 884-887 is formed in the dielectric body 875 between each set of adjacent terminals 811/812, 812/813, 813/814, 814/815, 816/817, 817/818, 818/819, 819/820 in each row 871, 873. Similarly, at the top surface 880, one of the third mold flow channels 890-893 is formed in the dielectric body 875 between each set of adjacent terminals 811/812, 812/813, 813/814, 814/815, 816/817, 817/818, 818/819, 819/820 in each row 871, 873. In addition, at the bottom surface 881, the second mold flow channel 888 is formed in the dielectric body 875 between the rows 871, 873, or between each set of adjacent terminals 811/816, 812/817, 813/818, 814/819, 815/820. Similarly, at the top surface 880, the fourth mold flow channel 894 is formed in the dielectric body 875 between the rows 871, 873, or between each set of adjacent terminals 811/816, 812/817, 813/818, 814/819, 815/820. In other words, each set of adjacent terminals 811/812, 812/813, 813/814, 814/815, 816/817, 817/818, 818/819, 819/820, 811/816, 812/817, 813/818, 814/819, 815/820 is separated by an intermediate portion of the dielectric body 875, and each mold flow channel 884-888, 890-894 extends through one of the intermediate portions of the dielectric body 875 between the adjacent terminals 811/812, 812/813, 813/814,

814/815, 816/817, 817/818, 818/819, 819/820, 811/816, 812/817, 813/818, 814/819, 815/820.

According to various embodiments, the first and second mold flow channels 884-888 are open along and extend upward into the dielectric body 875 from the bottom surface 881, and the third and fourth mold flow channels 890-894 are open along and extend upward into the dielectric body 875 from the top surface 880. Each of the mold flow channels 884-888, 890-894 is defined by an interior surface (not numbered), which may have any of various shapes. For example, in the embodiment of FIG. 8, the interior surface has vertical sidewalls and a curved upper extent. In other embodiments, the interior surface may have vertical sidewalls and a flat upper extent. Either way, the height 833 of the first and second mold flow channels 884-888 (i.e., the distance between the bottom surface 881 and the upper extent of the channel 884-888) and the height 834 of the third and fourth mold flow channels 890-894 may be in a range of about 10 percent to about 40 percent (or about 20 percent to about 30 percent) of the height 832 of the dielectric body 875.

Terminal interposer 800 may be utilized for any of the terminal interposers 141-147 of FIG. 1. To incorporate the terminal interposer 800 into a module (e.g., module 100, FIG. 1), the conductive pads 842 on the bottom surface 881 of the dielectric body 875 may be soldered or otherwise attached to one or more conductive pads (e.g., pads 361, FIG. 3) on the surface of a module substrate, and those pads may be electrically coupled to one or more of the conductive layers 301-304 of the module substrate. Terminal interposer 800 may be used as a peripheral terminal interposer (e.g., interposers 141-146) or as an interior terminal interposer (e.g., interposer 147). Either way, when molding compound or encapsulant material (e.g., encapsulant material 280, FIGS. 2-5) is applied over the module substrate (e.g., substrate 110) to which the terminal interposer 800 is attached, the molding compound surrounds some or all of the side surfaces (e.g., side surfaces 877-879 for a peripheral terminal interposer or all side surfaces 876-879 for an interior terminal interposer), and flows into the mold flow channels 884-888, 890-894, essentially filling the mold flow channels 884-888, 890-894 with molding compound.

According to an embodiment, and as will be explained in more detail in conjunction with FIGS. 10-16, during parallel fabrication of a panel of multiple modules, the first row 871 of terminals 811-815 may be attached to conductive pads of a first pre-singulated module (e.g., pads 1244 of module 1201, FIG. 12), and the second row 873 of terminals 816-820 may be attached to conductive pads of a second pre-singulated module (e.g., pads 1243 of module 1203, FIG. 12). Encapsulant material (e.g., encapsulant material 280, FIGS. 2-5) may then be applied over the panel of module substrates (e.g., panel 1200, FIG. 12) to which the terminal interposer 800 is attached. The molding compound would surround all of the side surfaces of the terminal interposer 800, and flow into the mold flow channels 884-888, 890-894, essentially filling the mold flow channels 884-888, 890-894 with molding compound. During a singulation process (e.g., block 1108, FIG. 11), the attached terminal interposer 800 may be cut through along mold flow channels 888, 894, which results in a first, single-row terminal interposer coupled to the first post-singulated module (e.g., module 1601, FIG. 16), and a second, single-row terminal interposer coupled to the second post-singulated module (e.g., module 1603, FIG. 16).

As mentioned previously, when the interposer 800 is incorporated into a module (e.g., module 100, FIG. 1), the height 832 of the interposer 800 may be approximately equal to the thickness (e.g., thickness 384, FIG. 3) of the encapsulant material (e.g., encapsulant material 280), so that the top conductive pad 841 of each interposer terminal 811-820 may be substantially co-planar with the contact surface (e.g., surface 282, FIGS. 2-5) of the module. In other embodiments, the top conductive pad 841 of each interposer terminal may be recessed below or extend above the contact surface of the module.

Figure 9:
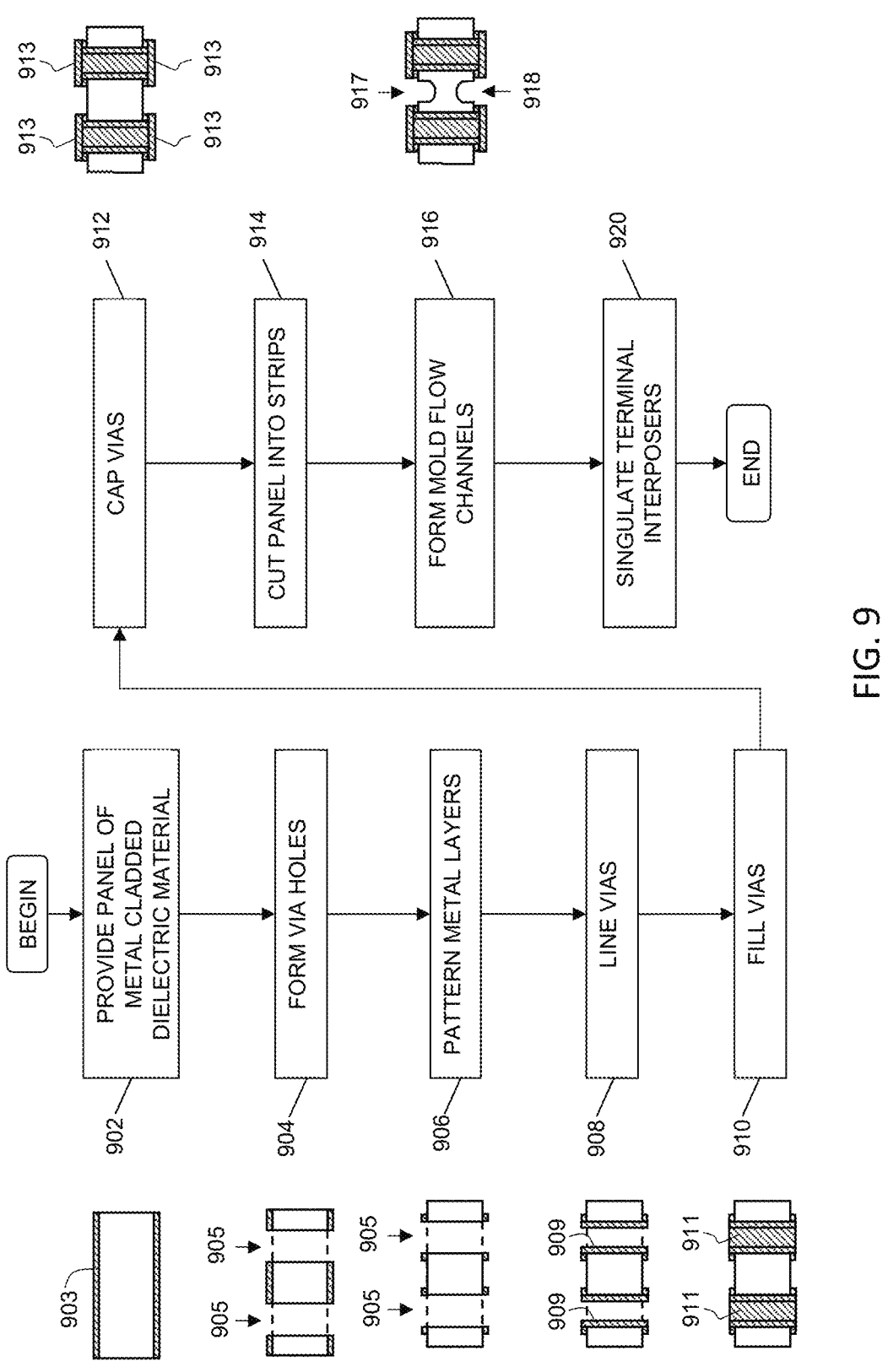
FIG. 9 is a flowchart of a method for fabricating a terminal interposer with mold flow channels, in accordance with several example embodiments.

FIG. 9 is a flowchart of a method for fabricating a terminal interposer (e.g., any of terminal interposers 141-148, 600, 700, 800) with terminals and mold flow channels, in accordance with several example embodiments. For enhanced understanding, cross-sectional drawings corresponding to some of the method steps are shown next to the corresponding flowchart blocks. According to various embodiments, a plurality (e.g., from tens to hundreds) of terminal interposers may be fabricated simultaneously from a single panel. For example, some embodiments include performing initial method steps on a metal-cladded panel to produce a large array of partially-formed terminal interposers, and the panel may then be divided into strips that include smaller arrays of partially-formed terminal interposers. Additional method steps may be performed on each strip of partially-formed terminal interposers, and ultimately multiple terminal interposers may be singulated from each strip. It should be noted that each drawings depicts just a small cross-sectional portion of such a panel/strip in order to illustrate some of the salient features of the method.

The method begins, in block 902, by providing a panel 903 of metal-cladded dielectric material. The dielectric material of the panel 903 corresponds to the dielectric body (e.g., body 175, 675, 775, 875, FIGS. 1, 3-8) of the above-described terminal interposers (e.g., terminal interposers 141-147, 600, 700, 800, FIGS. 1-8). For example, the dielectric material of the panel 903 may include one or more materials selected, for example, from ceramic, glass, FR-4, a dielectric laminate, or one or more other suitable dielectric materials. Metal cladding (or metal layers) on the top and bottom surfaces of the dielectric material may be formed from an electrically conductive material such as, for example, from copper, aluminum, or another suitable metal.

In block 904, a plurality of via holes 905 are formed through the panel 903 in locations that correspond to the ultimate locations of the terminals. For example, the via holes 905 may be formed by drilling through the panel 903, or by other suitable methods.

In block 906, the metal cladding at the top and bottom surfaces of the dielectric material are patterned (e.g., etched) to remove conductive material from the surface of the panel 903 between each via hole 905, and thus to electrically isolate each of the to-be-formed terminals. In alternate embodiments, the sequence of performing blocks 904 and 906 may be reversed (e.g., the metal cladding may be patterned before the via holes 905 are drilled).

In block 908, the via holes 905 are plated with a conductive plating material 909. For example, the conductive plating material 909 may include copper, aluminum, or another suitable metal.

In block 910, the via holes 905 are then filled with filler material 911. For example, the filler material 911 may be screen printed and squeegeed into the via holes 905 in order to fully or at least partially fill the via holes 905. For example, the filler material 911 may include copper, aluminum, conductive or non-conductive epoxy, or another suitable material.

In block 912, the filled vias are then capped with a conductive layer 913. For example, a plating process may be performed to deposit the conductive layer 913 at the top and bottom ends of each filled via. For example, the conductive layer 913 may be formed from copper, aluminum, or other suitable materials. This completes the process of forming the terminals (e.g., terminals 112, 114, 167, 148, 611-615, 711-720, 811-820, FIGS. 1-8) in the panel.

In block 914, the panel of terminals may be cut into smaller strips that are better sized for the following fabrication steps. Each strip includes an array of terminals arranged in rows and columns. In other embodiments, the panel may not be cut into strips, and the following fabrication steps may be performed on the panel of terminals.

In block 916, mold flow channels 917, 918 may then be formed (e.g., by sawing or routing) in the top and/or bottom surfaces of each strip/panel between the terminals. As discussed in detail above, first mold flow channels may extend in parallel between rows of terminals. In addition, second mold flow channels may extend in parallel between columns of terminals (i.e., the first and second mold flow channels are perpendicular to each other).

Once the desired mold flow channels 917, 918 are formed, the individual terminal interposers may then be singulated from the strip/panel in block 920. For example, a sawing process may be used to singulate each terminal interposer along saw streets in the strip/panel. This completes the process of forming the terminal interposers, and the singulated units may be prepared for later assembly into a circuit module (e.g., module 100, 1201-1204, 1601-1604, FIGS. 1-3, 12, 16). For example, a tape and reel process may be used to package the terminal interposers in pockets of a carrier tape, and coil the carrier tape onto a reel for later use during module assembly.

As discussed previously in conjunction with FIGS. 1-8, one or more terminal interposers may be incorporated into a circuit module (e.g., module 100, FIG. 1), and the circuit module may be incorporated into a larger electrical system. To incorporate embodiments of circuit module 100 into a larger electrical system (e.g., a final stage amplifier of a cellular base station), one surface of the circuit module 100 is physically and electrically coupled to a system substrate, and a heat sink is attached to the opposite surface of the circuit module 100. To illustrate the integration of circuit module 100 into such a system, reference is now made to FIG. 10, which is a cross-sectional, side view of an amplifier system 1000 that includes the circuit module 100 of FIG. 1 coupled to a system substrate 1010 and a heat sink 1016, in accordance with an example embodiment.

The RF system 1000 generally includes a system substrate 1010, circuit module 100, and a heat sink 1016. According to an embodiment, the system substrate 1010 includes a multi-layer printed circuit board (PCB) or other suitable substrate. The system substrate 1010 has a top surface 1009 (also referred to as a "mounting surface"), an opposed bottom surface 1011. The system substrate 1010 also includes a plurality of dielectric layers 1005, 1006, 1007 (e.g., formed from FR-4, ceramic, or other PCB dielectric materials), in an alternating arrangement with a plurality of conductive layers 1001, 1002, 1003, where patterned conductive layer 1001 is at the top surface 1009 of the system substrate 1010. It should be noted that, although system substrate 1010 is shown to include three dielectric layers 1005-1007 and three conductive layers 1001-1003, other embodiments of a system substrate may include more or fewer dielectric layers and/or conductive layers.

Each of the various conductive layers 1001-1003 may have a primary purpose, and also may include conductive features that facilitate signal and/or voltage/ground routing between other layers. Although the description below indicates a primary purpose for each of the conductive layers 1001-1003, it should be understood that the layers (or their functionality) may be arranged differently from the particular arrangement best illustrated in FIG. 10 and discussed below.

For example, in an embodiment, the patterned conductive layer 1001 at the mounting surface 1009 of the system substrate 1010 may primarily function as a signal conducting layer. More specifically, layer 1001 includes a plurality of conductive features (e.g., conductive pads and traces) which serve as attachment points for module 100, an input RF connector 1091, and an output RF connector 1092. Each of RF connectors 1091, 1092 may, for example, be coaxial connectors with a central signal conductor 1093 and an outer ground shield 1094. According to an embodiment, the signal conductor 1093 of RF input connector 1091 is electrically coupled to a first conductive trace 1012 of layer 1001, which in turn is coupled to input terminal 112 of module 100, as described in more detail below. In addition, the signal conductor 1093 of RF output connector 1092 is electrically coupled to a second conductive trace 1014 of layer 1001, which in turn is coupled to an output terminal (e.g., terminal 114, FIG. 1) of module 100. The ground shields 1094 of connectors 1091, 1092 are electrically coupled to additional traces (not numbered), which in turn are electrically coupled to a system ground layer 1002 of the system substrate 1010 through conductive vias 1095 that extend between layers 1001 and 1002.

As just indicated, conductive layer 1002 functions as a system ground layer. In addition to being electrically coupled to the ground shields 1094 of connectors 1091, 1092, the system ground layer 1002 also is electrically coupled through additional conductive vias (e.g., via 1096) to additional ground pads (e.g., pad 1041) on the mounting surface 1009. The additional ground pads 1041 are physically and electrically coupled to various ground terminals of module 100.

Module 100 is coupled to the mounting surface 1009 of system substrate 1010 in an inverted (or "flipped") orientation from the orientation depicted in FIG. 3. More specifically, module 100 is coupled to the system substrate 1010 so that the contact surface 382 of the module 100 and the mounting surface 1009 of the system substrate 1010 face each other. In order to connect module 100 to system substrate 1010, each of the terminals of module 100 (e.g., terminals 112, 114, 148, 167, FIG. 1) are aligned and brought into contact with corresponding pads (e.g., pads 1013, 1015, 1041) on the mounting surface 1009 of system substrate 1010. In embodiments in which conductive attachment material 383 is disposed on the exposed ends of the module terminals, the conductive attachment material 383 is reflowed or otherwise cured to physically connect the module terminals to their corresponding pads on the mounting surface 1009 of the module substrate 1010. In other embodiments, conductive attachment material also or alternatively may be disposed on the conductive pads (e.g., pads 1013, 1015, 1041) of the system substrate 1010, and an appropriate reflow or curing process may be performed to connect the module 100 to the system substrate 1010.

According to an embodiment, a heat sink 1016 is physically and thermally coupled to the bottom surface 111 of the circuit module 100, and more specifically to conductive layer 304 and/or the surface(s) 1017 of the embedded heat dissipation structure(s) 116 of module 100. The heat sink 1016 is formed from a thermally-conductive material, which also may be electrically-conductive. For example, the heat sink 1016 may be formed from copper or another bulk conductive material. To couple the heat sink 1016 to the circuit module 100, a thermally conductive material 1098 (e.g., thermal grease) may be dispensed on the bottom surface 111 of the module 100 (and/or on the surface(s) 1017 of the heat dissipation structure(s) 116) and/or the heat sink 1016. The heat sink 1016 then may be brought into contact with the bottom surface 111. The heat sink 1016 may then be clamped, screwed, or otherwise secured in place.

During operation of RF system 1000, input RF signals are provided through the RF input terminal 1091 and trace/pad 1012/1013 to an RF input terminal (e.g., terminal 112, FIG. 1) at the contact surface 382 of the circuit module 100. The input RF signals are conveyed through the RF input terminal and additional components (e.g., power splitter 120, FIG. 1) to the power transistor dies (e.g., dies 133, 134, 153, 154, FIG. 1), which amplify the input RF signal as discussed previously. The amplified output RF signals are produced at an RF output terminal (e.g., terminal 114, FIG. 1), which is electrically coupled to trace/pad 1014/1015, and to the RF output terminal 1092.

During operation, significant thermal energy (heat) may be produced by the power transistor(s) within the power transistor dies. As indicated by arrows 1099, the thermal energy produced by the power transistor(s) is conveyed through the thermal dissipation structure(s) 116 to the heat sink 1016, which effectively dissipates the heat to the ambient atmosphere.

Figure 10:
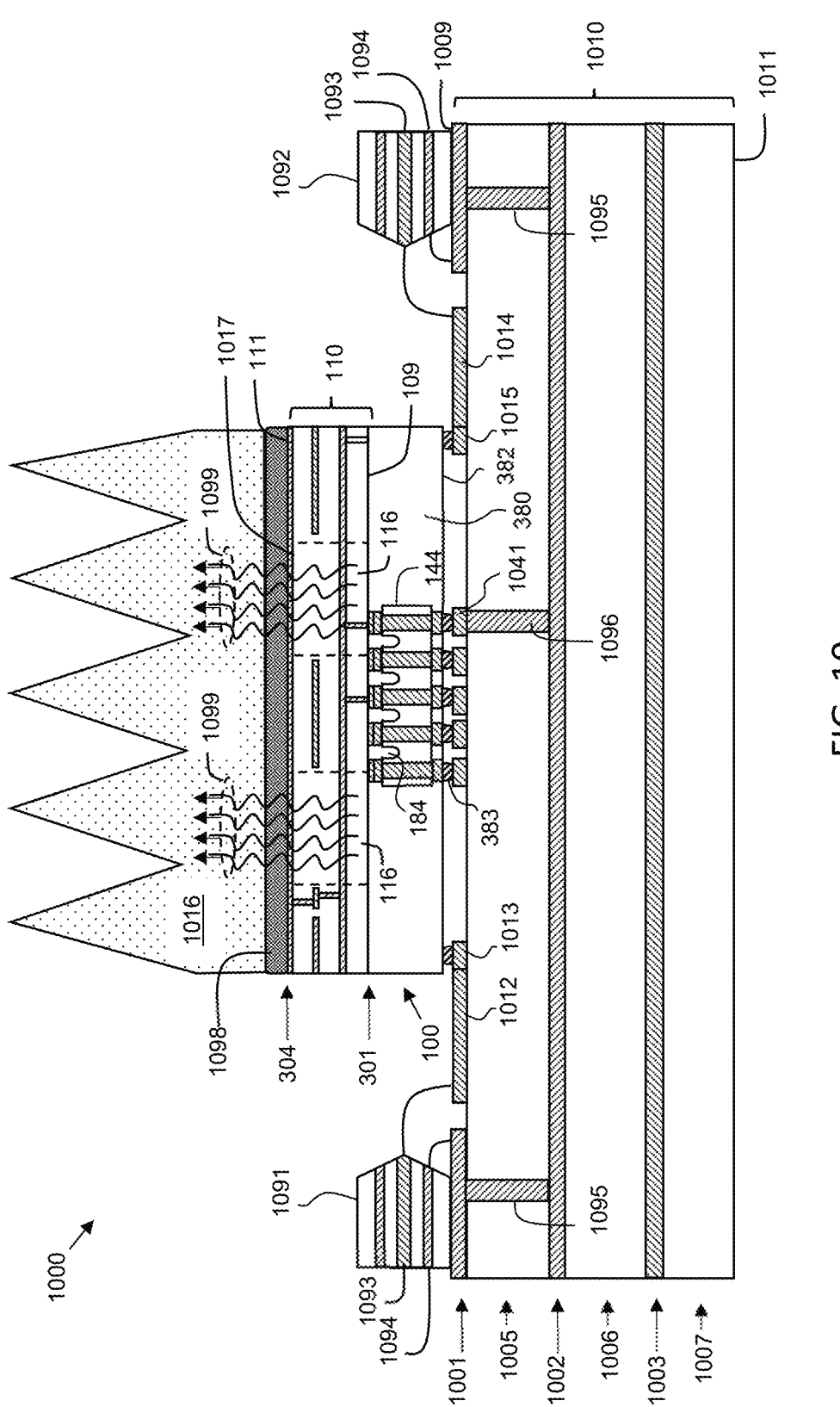
FIG. 10 is a cross-sectional, side view of an amplifier system that includes the circuit module of FIG. 1 coupled to a system substrate and a heat sink, in accordance with an example embodiment.
Figure 11:
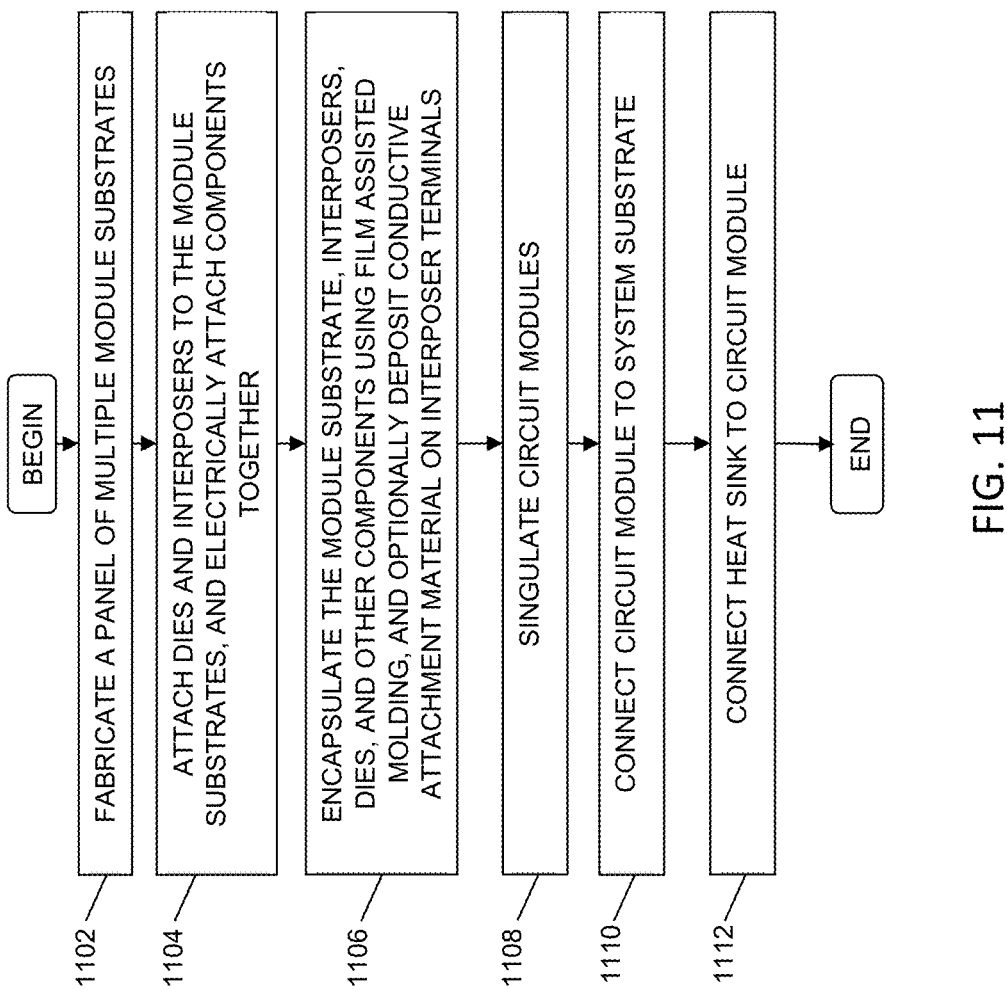
FIG. 11 is a flowchart of a method for fabricating a circuit module with terminal interposers, in accordance with an example embodiment.

FIG. 11 is a flowchart of a method of fabricating a circuit module (e.g., circuit module 100, FIG. 1) and assembling the circuit module into an electronic system (e.g., system 1000, FIG. 10). According to an example embodiment, the circuit module is fabricated in the context of a strip or panel of (typically) identical modules, which are singulated at a later fabrication step. To illustrate the parallel fabrication process, FIGS. 12-16 depict a panel 1200 of four pre-singulated modules 1201-1204 (delineated with dashed-lines) at various points in the fabrication process, although those of skill in the art would understand, based on the description herein, that a strip or panel of parallel-fabricated modules typically would include substantially more than four modules. An assumption is made that the panel 1200 would include additional modules (not illustrated) surrounding modules 1201-1204.

Figure 12:
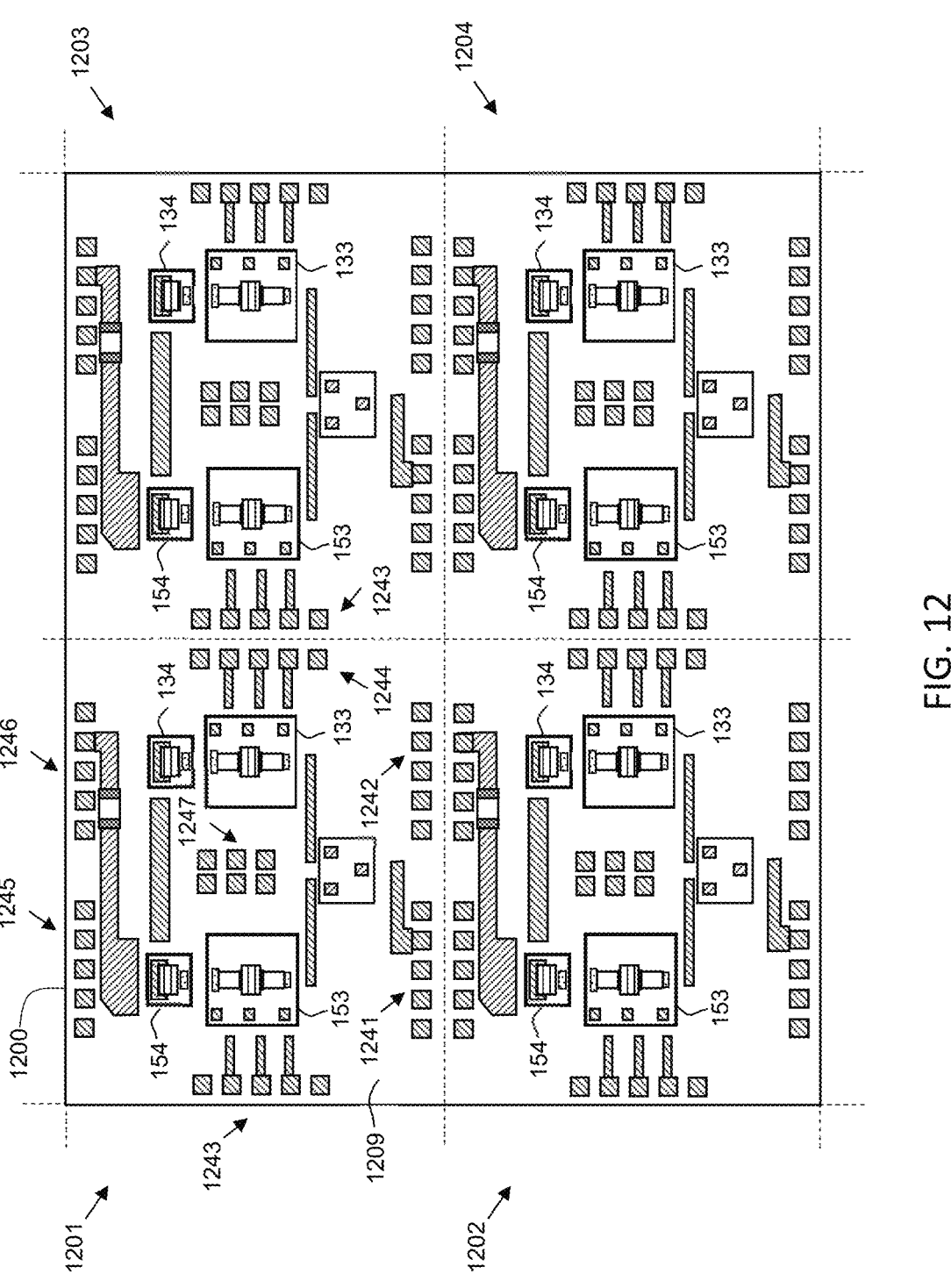
FIG. 12 is a top view of a panel of module substrates at a first stage of manufacture, in accordance with an example embodiment.

Starting first with block 1102 and referring to the top view of FIG. 12, the method may begin by fabricating a panel 1200 of multiple, multi-layer module substrates 1201, 1202, 1203, 1204 (e.g., multiple instances of module substrate 110, FIGS. 1, 3) and attaching various dies thereto. As discussed previously, formation of the module substrates 1201-1204 may include producing a multi-layer PCB, where a top patterned conductive layer (e.g., layer 301, FIG. 3) at a mounting surface 1209 (e.g., surface 109, FIGS. 1, 3) includes a plurality of conductive pads and traces that are positioned according to the circuits that are to be housed by the modules. As discussed previously, some of the pads correspond to signal, ground, or bias pads to which terminal interposers will be connected (e.g., groups of interposer pads 1241-1247). In addition, each module 1201-1204 may include a plurality of thermal dissipation structures (e.g., thermal dissipation structures 116, FIG. 1, including conductive coins and/or thermal vias). To prepare for attachment of the various circuit components and interposers, a solder print process may be performed in which solder (or solder paste, conductive adhesive or other conductive attachment material) is deposited on those conductive pads to which corresponding leads, pads, or terminals of the various circuit components and interposers will be attached. Block 1102 also includes attaching various discrete components to the prepared conductive pads. For example, a component placement process and machinery (e.g., pick and placement machinery, such as a chip shooter or flexible placer) may be utilized to rapidly place various discrete components (e.g., capacitors, resistors, etc.) in their appropriate locations on the modules 1201-1204.

In block 1104, a die attach/bonding process may be used to place and attach the power transistor dies 133, 134, 153, 154 in their appropriate locations on the modules 1201-1204. For example, the power transistor dies 133, 134, 153, 154 may be attached to the exposed, top surfaces of thermal dissipation structures (e.g., e.g., thermal dissipation structures 116, FIG. 1, including conductive coins and/or thermal vias) using solder, sintering, conductive adhesive, or other attachment means.

Figure 13:
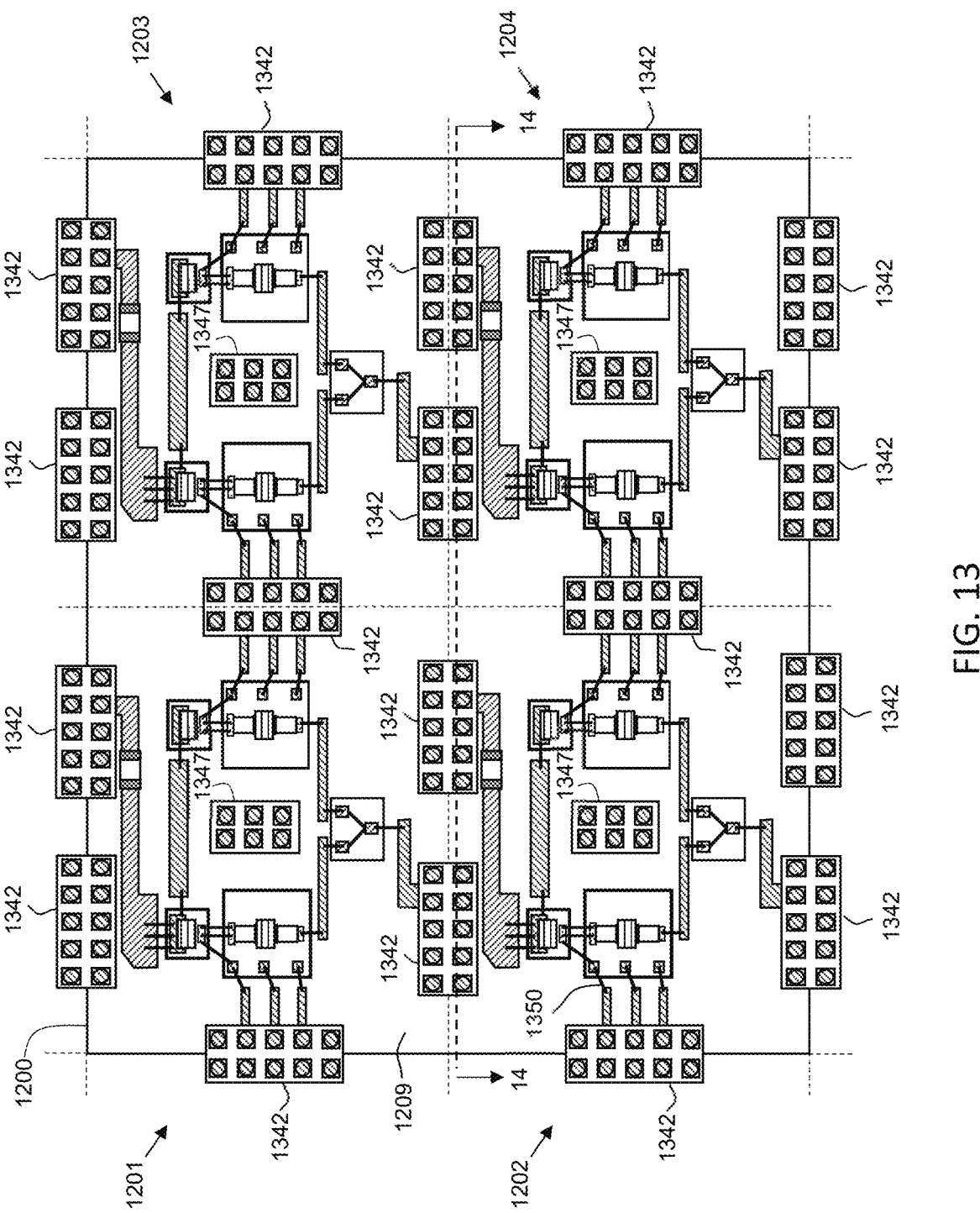
FIG. 13 is a top view of the panel of module substrates of FIG. 12 at a second stage of manufacture, in accordance with an example embodiment.

Referring now to FIG. 13, which illustrates a top view of panel 1200 at a subsequent fabrication step, a plurality of peripheral and interior terminal interposers 1342, 1347 are then attached, using a die attach/bonding process, to the interposer pads 1241-1247 (FIG. 12) on the mounting surface 1209 of the panel 1200. For example, each of the peripheral and interior terminal interposers 1342, 1347 may have a structure that is similar or identical to either of the two-row terminal interposers 700, 800 discussed in conjunction with FIGS. 7 and 8, in some embodiments. When used as peripheral terminal interposers 1342, the two-row terminal interposers 1342 may span across the boundaries of adjacent modules 1201-1204 (and modules, not illustrated, surrounding modules 1201-1204). Accordingly, for the two-row terminal interposers 1342, one row of an interposer 1342 overlies and connects with the interposer pads for one module, and the other row of the same interposer 1342 overlies and connects with the interposer pads for an adjacent module. For example, referring again briefly to FIG. 12, one row of terminals of a terminal interposer 1342 may be connected to pads 1244 of module 1201, and the other row of terminals of the same terminal interposer 1342 may be connected to pads 1243 of module 1203. In alternate embodiments, single-row terminal interposers (e.g., terminal interposer 500, FIG. 5) may be coupled to the pads 1241-1244 of each module 1201-1204 (i.e., the terminal interposer does not span across two modules).

The peripheral terminal interposers 1342 may have first mold flow channels between terminals that extend in parallel in a single direction, or may have first mold flow channels that extend in a first direction (e.g., between terminals in each row), and second mold flow channels that extend in a second direction that is perpendicular to the first direction (e.g., between rows of terminals). Further, the peripheral terminal interposers 1342 may have mold flow channels at the bottom surface of the interposer and/or at the top surface of the interposer.

The interior interposers 1347 are coupled to interposer pads 1247 between dies 133/134 and 153/154 (or between the carrier and peaking paths). In various embodiments, the interior interposers 1347 may be two-row interposers 1347 (e.g., terminal interposers 700, 800, FIGS. 7, 8), as shown in FIG. 13, or the interior interposers 1347 may be single-row interposers (e.g., terminal interposer 600, FIG. 6). The interior terminal interposers 1347 may have first mold flow channels between terminals that extend in parallel in a single direction, or may have first mold flow channels that extend in a first direction (e.g., between terminals in each row), and second mold flow channels that extend in a second direction that is perpendicular to the first direction (e.g., between rows of terminals). Further, the interior interposers 1347 may have mold flow channels at the bottom surface of the interposer and/or at the top surface of the interposer.

Block 1104 also includes electrically attaching the components and dies together and to conductive pads and traces of the top patterned conductive layer. For example, the electrical attachments may be made using wirebonds (e.g., wirebond 1350). Finally, the various components, dies, and interposers are secured to the panel 1200 by heating the panel 1200 in a reflow oven for a period of time sufficient to reflow solder or solder paste previously applied to the substrate pads, die and component pads and terminals, and terminal interposer pads, and thus to secure the various dies, components, and terminal interposers to the panel 1200. The panel 1200 may then be defluxed and otherwise cleaned to prepare the panel 1200 for the next fabrication phase.

After attachment of the various dies, components, terminal interposers, and electrical connections, encapsulant material (e.g., encapsulant material 280, FIGS. 2-6) is applied over the mounting surface 1209 of the panel 1200 to complete fabrication of the panel 1200. As discussed in detail previously, the encapsulant material also flows into the various mold flow channels of the terminal interposers 1342, 1347 to more securely and robustly secure the terminal interposers 1342, 1347 to the panel 1200.

Figures 14, 15:
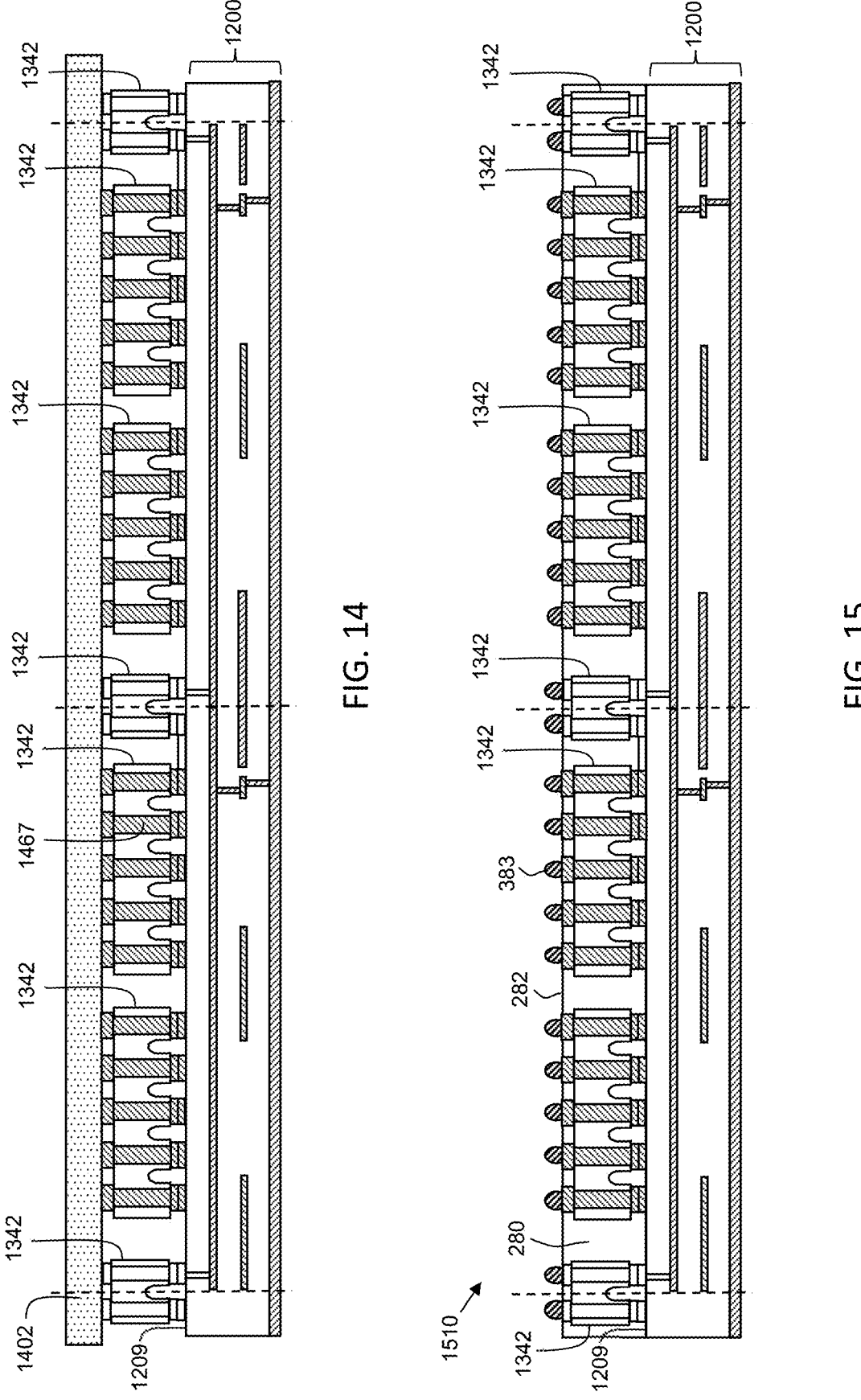
FIG. 14 is a side view of the panel of module substrates of FIG. 13 at a third stage of manufacture, in accordance with an example embodiment.
FIG. 15 is a side view of the panel of module substrates of FIG. 14 at a fourth stage of manufacture, in accordance with an example embodiment.

Any one of several methods may be performed to apply the encapsulant material and complete the panel 1200. In some embodiments, as depicted in block 1106 and illustrated in FIG. 14, a film assisted molding (FAM) process is performed to apply the encapsulant material. Referring to FIG. 14, which is a side, cross-sectional view of panel 1200 along line 14-14 (FIG. 13), the FAM process includes placing a film 1402 (e.g., QFN film) over the mounting surface 1209 of the panel 1200 so that an adhesive side of the film 1402 contacts and protects the distal ends of the interposer terminals 1467 (e.g., terminals 112, 114, 148, 167, 611-615, 711-720, 811-820, FIGS. 1-8). During the FAM process, the interposers 1342, 1347 function to support the film 1402 above the mounting surface 1209 of the panel 1200. Viscous encapsulant material 280 is then flowed onto the mounting surface 1209 below the film 1402. As discussed in detail previously, the encapsulant material 280 also flows into the mold flow channels of the terminal interposers 1342, 1347. Referring now to FIG. 15, after curing the encapsulant material 280 and removing the film 1402, the result is a panel 1510 of encapsulated modules. Optionally, conductive attachment material 383 (e.g., solder, solder paste or conductive adhesive) may then be deposited on the exposed, distal ends of the terminals to prepare each module for subsequent attachment to a system substrate (e.g., substrate 1010, FIG. 10). Alternatively, the conductive attachment material 383 may be applied during a later step (e.g., block 1110, described below).

An alternate embodiment of block 1106, an overmolding and encapsulant drilling process is performed to apply the encapsulant material and to expose the terminals. The overmolding process includes applying the viscous encapsulant material 280 onto the mounting surface 1209 so that the encapsulant material 280 flows into the mold flow channels and entirely covers the mounting surface 1209, the components and dies, and the terminal interposers 1342, 1347, and extends some distance above the top surfaces of the interposers 1342, 1347. This results in a panel of encapsulated modules. After curing the encapsulant material 280, a plurality of openings are formed through the top surface of the encapsulant material 280 to expose the distal ends of the terminals. Conductive attachment material 383 (e.g., solder, solder paste or conductive adhesive) may then be deposited into the openings and onto the exposed, distal ends of the terminals to prepare each module for subsequent attachment to a system substrate (e.g., substrate 1010, FIG. 10). Alternatively, the conductive attachment material 383 may be applied during a later step (e.g., block 1110, described below).

In yet another alternate embodiment of block 1106, prior to application of the encapsulant material 280, conductive attachment material 383 (e.g., solder, solder paste or conductive adhesive) is applied to the exposed ends of the interposer terminals. An overmolding process is then performed, which includes applying viscous encapsulant material 280 into the mold flow channels and onto the mounting surface 1209 so that the encapsulant material 280 entirely covers the mounting surface 1209, the components and dies, the terminal interposers 1342, 1347, and the conductive attachment material 383, and extends some distance above the top surfaces of the interposers 1342, 1347 and the conductive attachment material 383. This results in a panel of encapsulated modules. After curing the encapsulant material 280, a plurality of openings are formed through the top surface of the encapsulant material 280 to expose the conductive attachment material 383 (e.g., to expose the solder domes).

Referring again to FIG. 11, after performing the overmolding process in block 1106, a singulation process is performed in block 1108 in order to separate each of the completed circuit modules 1201-1204 from the panel. For example, referring to FIG. 16, the panel may be mechanically, chemically, or laser cut along saw streets that correspond with the module edges (e.g., the dashed lines in FIG. 12). When the peripheral terminal interposers 1342 are used that span the saw streets between adjacent first and second modules (e.g., between modules 1201 and 1203), the peripheral terminal interposers 1342 are cut in half so that one half is attached to the first module, and the other half is attached to the second module. The singulation process results in a plurality of separate, post-singulated modules 1601, 1602, 1603, 1604, each of which is ready for attachment to a system substrate (e.g., system substrate 1010, FIG. 10). In addition, the singulation process ensures that first, second, third, and fourth sides of each module substrate are co-planar with first, second, third, and fourth sides of the encapsulant material 280 overlying each module substrate.

As mentioned previously, either single-row or double-row terminal interposers 1342, 1347 may be attached to the module substrates 1201-1204. The mold flow channels within the terminal interposers 1342, 1347 function to more robustly secure the terminal interposers to the module substrate.

When the terminal interposers 1342, 1347 only include mold flow channels (e.g., mold flow channels 184, 684-687, 784-787, 884-887, 890-893, FIGS. 1-8) extending between the terminals in a single direction (e.g., perpendicular to the edge of the module), after singulation of the modules, the side view of the peripheral interposers of the module may look substantially similar to the side view of FIG. 4. Alternatively, when the terminal interposers 1342, 1347 include both first mold flow channels (e.g., mold flow channels 184) extending in a first direction, and second mold flow channels (e.g., mold flow channels 585, 788, 888, 894, FIGS. 5, 7, 8) extending in a second direction that is perpendicular to the first direction, the side view of the peripheral interposers of the module may look substantially similar to the side view of FIG. 5. More specifically, as described in conjunction with FIG. 5, in embodiments in which the peripheral terminal interposers 1342 include mold flow channels that are parallel to and span the singulation lines for the panel (e.g., mold flow channels 585, 788, 888, 894, FIGS. 5, 7, 8), after singulation, the side of the module will have encapsulant material 280 that extends along the bottom half of the entire terminal interposer 1342 at the side of the module. The additional encapsulant material 280 along the side of the module may further reduce the possibility of delamination at the side of the module.

Referring again to FIG. 11, in block 1110, a module 100 (e.g., any one of modules 100, 1601-1604) is prepared for attachment to a system substrate (e.g., system substrate 1010, FIG. 10). If conductive attachment material (e.g., material 383, such as solder, solder paste, or conductive adhesive) has not been pre-applied (e.g., in block 1106), then the conductive attachment material is applied during this step. For example, the conductive attachment material may be applied to either or both of the module terminals and/or corresponding pads (e.g., pads 1013, 1015, 1041, FIG. 10) on the mounting surface of the system substrate. The module 100 is then inverted, and the module terminals are aligned with and brought into contact with the corresponding pads on the mounting surface of the system substrate. The conductive attachment material (e.g., material 383) is then reflowed, cured, or otherwise processed to produce a mechanical and electrical connection (e.g., solder joints) between the module terminals and the system substrate pads. This establishes signal, ground, and bias voltage paths between the module 100 and the system substrate 1010.

Finally, in block 1112, a heat sink (e.g., heat sink 1016, FIG. 10) is attached to the bottom surface (e.g., surface 111, FIGS. 3, 10) of the module substrate 110. For example, the heat sink may be attached to the module substrate using a thermally conductive material (e.g., material 1098, such as thermal grease), clamps, screws, and/or other attachment means. The method then ends.

Various embodiments of a terminal interposer include a dielectric body with a top surface, a bottom surface, first and second parallel side surfaces, and a first mold flow channel extending between the first and second parallel side surfaces. A first conductive terminal is embedded within the dielectric body and extends between the top and bottom surfaces of the dielectric body at a first side of the first mold flow channel. A second conductive terminal also is embedded within the dielectric body and extends between the top and bottom surfaces of the dielectric body at a second side of the first mold flow channel.

According to a further embodiment, the dielectric body also includes second and third parallel side surfaces, and a second mold flow channel extending between the third and fourth parallel side surfaces of the dielectric body. The first and second mold flow channels may extend in perpendicular directions. According to another further embodiment, the dielectric body also includes a second mold flow channel that is open along and extends into the top surface of the dielectric body between the first and second conductive terminals.

Various embodiments of a circuit module include a module substrate, a terminal interposer, and encapsulant material. The module substrate has a mounting surface and a plurality of conductive pads at the mounting surface. The terminal interposer is coupled to the mounting surface of the module substrate, and the terminal interposer includes a dielectric body and a conductive terminal. The dielectric body has top, bottom, and side surfaces, and one or more mold flow channels extending from at least one of the side surfaces into the dielectric body. The conductive terminal is embedded within the dielectric body and extends between the top and bottom surfaces of the dielectric body. A proximal end of the conductive terminal is coupled to a first conductive pad of the plurality of conductive pads. The encapsulant material covers at least a portion of the mounting surface of the module substrate and extends into the one or more mold flow channels.

Various embodiments of methods of fabricating a circuit module include coupling a terminal interposer to a conductive pad at a mounting surface of a module substrate. The terminal interposer includes a dielectric body with top, bottom, and side surfaces, one or more conductive terminals embedded within the dielectric body, and one or more mold flow channels extending from at least one of the side surfaces into the dielectric body. The method further includes covering the mounting surface of the module substrate and the terminal interposer with encapsulant material. A portion of the encapsulant material is present within the one or more mold flow channels, a first surface of the encapsulant material defines a contact surface of the circuit module, and distal ends of the one or more conductive terminals are exposed at the contact surface.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A terminal interposer comprising:
a dielectric body with a top surface, a bottom surface, first and second parallel side surfaces, second and third parallel side surfaces, a first mold flow channel extending between the first and second parallel side surfaces, and a second mold flow channel extending between the third and fourth parallel side surfaces;
a first conductive terminal embedded within the dielectric body and extending between the top and bottom surfaces of the dielectric body at a first side of the first mold flow channel; and
a second conductive terminal embedded within the dielectric body and extending between the top and bottom surfaces of the dielectric body at a second side of the first mold flow channel.

2. The terminal interposer of claim 1, wherein:
a height of the first mold flow channel is in a range of 10 percent to 75 percent of a height of the dielectric body.

3. The terminal interposer of claim 1, wherein:
the first mold flow channel is open along and extends into the bottom surface of the dielectric body.

4. The terminal interposer of claim 1, wherein:
the first and second mold flow channels extend in perpendicular directions.

5. The terminal interposer of claim 1, wherein the first conductive terminal includes a conductive via extending through the dielectric body, a first conductive pad at the bottom surface of the dielectric body and in contact with a proximal end of the conductive via, and a second conductive pad at the top surface of the dielectric body and in contact with a distal end of the conductive via.

6. The terminal interposer of claim 1, wherein:
the first and second conductive terminals are separated by a first intermediate portion of the dielectric body; and
the first mold flow channel extends through the first intermediate portion of the dielectric body between the first and second conductive terminals.

7. The terminal interposer of claim 6, wherein the terminal interposer further comprises:
a third conductive terminal embedded in the dielectric body and separated from the second conductive terminal by a second intermediate portion of the dielectric body; and
a third mold flow channel extending through the second intermediate portion of the dielectric body between the second and third conductive terminals.

8. A terminal interposer comprising:
a dielectric body with a top surface, a bottom surface, first and second parallel side surfaces, a first mold flow channel extending between the first and second parallel side surfaces, and a second mold flow channel that is open along and extends into the top surface of the dielectric body between the first and second conductive terminals;
a first conductive terminal embedded within the dielectric body and extending between the top and bottom surfaces of the dielectric body at a first side of the first mold flow channel; and a second conductive terminal embedded within the dielectric body and extending between the top and bottom surfaces of the dielectric body at a second side of the first mold flow channel.

9. The terminal interposer of claim 8, wherein the first mold flow channel is open along and extends into the bottom of the dielectric body between the first and second conductive terminals.

10. A circuit module comprising:
a module substrate with a mounting surface and a plurality of conductive pads at the mounting surface;
a first terminal interposer coupled to the mounting surface of the module substrate, wherein the first terminal interposer includes
a dielectric body with top, bottom, opposed first and second side surfaces that are parallel with a first side of module substrate, opposed third and fourth side surfaces that are perpendicular to the first side of module substrate, and one or more mold flow channels extending from at least one of the side surfaces into the dielectric body, wherein the one or more mold flow channels include a first mold flow channel extending between the first and second side surfaces of the dielectric body, and a second mold flow channel extending between the third and fourth side surfaces of the dielectric body, and
a first conductive terminal embedded within the dielectric body and extending between the top and bottom surfaces of the dielectric body, wherein a proximal end of the first conductive terminal is coupled to a first conductive pad of the plurality of conductive pads; and
encapsulant material covering at least a portion of the mounting surface of the module substrate and extending into the one or more mold flow channels.

11. The circuit module of claim 10, wherein:
the encapsulant material extends into the one or more mold flow channels, and the one or more mold flow channels function to hold the first terminal interposer in contact with the module substrate.

12. The circuit module of claim 10, wherein:
the one or more mold flow channels are located at the bottom surface of the dielectric body;
the one or more mold flow channels are bounded by the mounting surface of the module substrate and an interior surface of each of the one or more mold flow channels; and
the encapsulant material within the one or more mold flow channels contacts portions of the mounting surface underlying the one or more mold flow channels, and the interior surface of each of the one or more mold flow channels.

13. The circuit module of claim 10, wherein the first side surface of the dielectric body is co-planar with the first side of the module substrate.

14. The circuit module of claim 10, wherein:
a height of the one or more mold flow channels is in a range of 10 percent to 75 percent of a height of the dielectric body.

15. The circuit module of claim 10, wherein the first terminal interposer further comprises:
a second conductive terminal embedded in the dielectric body and separated from the first conductive terminal by a first intermediate portion of the dielectric body, wherein the first mold flow channel extends through the first intermediate portion of the dielectric body between the first and second conductive terminals.

16. The circuit module of claim 10, wherein:
the plurality of conductive pads is located at a first side of the module substrate;
the first side of the module substrate is co-planar with a first side of the encapsulant material; and
the first terminal interposer is exposed at the first side of the encapsulant material.

17. The circuit module of claim 10, further comprising:
a first semiconductor die coupled to the mounting surface of the module substrate, wherein the first semiconductor die includes an input/output terminal that is electrically coupled to the first conductive pad, and the encapsulant material covers the first semiconductor die.

18. The circuit module of claim 10, further comprising:
a second terminal interposer coupled to the mounting surface of the module substrate, wherein the second terminal interposer includes one or more additional mold flow channels, and wherein the encapsulant material extends into the one or more additional mold flow channels.

19. A method of fabricating a circuit module, the method comprising:
coupling a first terminal interposer to a first conductive pad at a mounting surface of a module substrate, wherein the first terminal interposer includes a dielectric body with a top surface, a bottom surface, first and second parallel side surfaces, second and third parallel side surfaces, one or more conductive terminals embedded within the dielectric body, a first mold flow channel extending between the first and second parallel side surfaces, and a second mold flow channel extending between the third and fourth parallel side surfaces, and
covering the mounting surface of the module substrate and the first terminal interposer with encapsulant material, wherein a portion of the encapsulant material is present within the first and second mold flow channels, a first surface of the encapsulant material defines a contact surface of the circuit module, and distal ends of the one or more conductive terminals are exposed at the contact surface.

20. The method of claim 19, further comprising:
coupling a semiconductor die to the mounting surface of the module substrate; and
wherein covering the mounting surface further includes covering the semiconductor die with the encapsulant material.

21. The method of claim 20, wherein the module substrate further includes a thermal dissipation structure, and coupling the semiconductor die to the mounting surface includes coupling the semiconductor die to the thermal dissipation structure.

* * * * *